(12) United States Patent
Saito et al.

(10) Patent No.: US 8,378,348 B2
(45) Date of Patent: Feb. 19, 2013

(54) SEMICONDUCTOR ELEMENT AND METHOD FOR MANUFACTURING THE SAME

(75) Inventors: Yuichi Saito, Osaka (JP); Masao Moriguchi, Osaka (JP); Akihiko Kohno, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 148 days.

(21) Appl. No.: 12/864,461

(22) PCT Filed: Jan. 8, 2009

(86) PCT No.: PCT/JP2009/000038
§ 371 (c)(1),
(2), (4) Date: Jul. 23, 2010

(87) PCT Pub. No.: WO2009/093410
PCT Pub. Date: Jul. 30, 2009

(65) Prior Publication Data
US 2011/0101354 A1 May 5, 2011

(30) Foreign Application Priority Data

Jan. 25, 2008 (JP) ................................. 2008-015647

(51) Int. Cl.
*H01L 31/00* (2006.01)
(52) U.S. Cl. ................ 257/59; 257/56; 257/57; 257/58; 257/E29.29
(58) Field of Classification Search ............... 257/56–59, 257/E29.29
See application file for complete search history.

(56) References Cited

U.S. PATENT DOCUMENTS 5,686,349 A 11/1997 Nakata
(Continued)

FOREIGN PATENT DOCUMENTS

JP    61-5578 A     1/1986
JP    62-160769 A   7/1987
(Continued)

OTHER PUBLICATIONS

C.W. Kim et al. "42.1: A Novel Four-Mask-Count Process Architecture for TFT-LCDs" AMLCD Division, Semiconductor Business, Samsung Electronics Co., Ltd. (2000) pp. 1006-1009.
(Continued)

*Primary Examiner* — Eugene Lee
*Assistant Examiner* — Elias M Ullah
(74) *Attorney, Agent, or Firm* — Birch, Stewart, Kolasch & Birch, LLP

(57) ABSTRACT

A semiconductor device 101 includes: a substrate 1; an active layer 4 provided on the substrate 1 and including a channel region 4c, and a first region 4a and a second region 4b that are respectively located on opposite sides of the channel region 4c; first and second contact layers 6a and 6b respectively in contact with the first and second regions 4a and 4b of the active layer 4; a first electrode 7 electrically coupled to the first region 4a via the first contact layer 6a; a second electrode 8 electrically coupled to the second region 4b via the second contact layer 6b; and a gate electrode 2 provided such that a gate insulating layer 3 is interposed between the gate electrode 2 and the active layer 4, the gate electrode 2 being configured to control a conductivity of the channel region 4c. The active layer 4 contains silicon. The semiconductor device further includes an oxygen-containing silicon layer 5 between the active layer 4 and the first and second contact layers 6a, 6b. The layer 5 contains oxygen at a concentration higher than the active layer 4 and the first and second contact layers 6a, 6b.

7 Claims, 21 Drawing Sheets

U.S. PATENT DOCUMENTS

2002/0132452 A1* 9/2002 Oka et al. .................. 438/478
2009/0020759 A1* 1/2009 Yamazaki .................... 257/59

FOREIGN PATENT DOCUMENTS

| JP | 64-57755 A | 3/1989 |
|---|---|---|
| JP | 5-304171 A | 11/1993 |
| JP | 5-335607 A | 12/1993 |
| JP | 6-196701 A | 7/1994 |
| JP | 8-148690 A | 6/1996 |
| JP | 2001-127296 A | 5/2001 |

OTHER PUBLICATIONS

Zhongyang Xu et al. "A Novel Thin-film Transistors With uc-Si/a-Si Dual Active Layer Structure for AM-LCD", Department of Solid State Electronics, Huazhong University of Science and Technoloy (1996) pp. 117-120.

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

SEMICONDUCTOR ELEMENT AND METHOD FOR MANUFACTURING THE SAME

BACKGROUND OF THE INVENTION

1. Field of the Invention

The present invention relates to a semiconductor device and a method for fabricating the semiconductor device.

2. Description of the Related Art

An active matrix substrate for use in a liquid crystal display device, or the like, includes a switching element, such as a thin film transistor (hereinafter, "TFT"), in each pixel. Examples of such a switching element which have been conventionally used in various applications include a TFT which includes an amorphous silicon film as an active layer (hereinafter, "amorphous silicon TFT") and a TFT which includes a polycrystalline silicon film as an active layer (hereinafter, "polycrystalline silicon TFT").

Since the mobility of electrons and holes in the polycrystalline silicon film is higher than in the amorphous silicon film, the polycrystalline silicon TFT has a higher ON current, and is capable of operating at a higher speed, than the amorphous silicon TFT. Thus, when an active matrix substrate is fabricated using the polycrystalline silicon TFT, the polycrystalline silicon TFT can also be used for a peripheral circuit, such as a driver and the like, as well as the switching elements. Therefore, there is an advantage that part or entirety of the peripheral circuit, such as a driver and the like, and a display portion can be integrally formed on the same substrate. Also, there is another advantage that the pixel capacitor of a liquid crystal display device, or the like, can be charged within a shorter switching time.

However, fabrication of the polycrystalline silicon TFT requires complicated steps, including a laser crystallization step for crystallization of the amorphous silicon film as well as a heat anneal step, an ion doping step, etc. These steps disadvantageously increase the fabrication cost per unit area of the substrate. Therefore, the polycrystalline silicon TFT has been mainly used in middle-size and small-size liquid crystal display devices.

On the other hand, the amorphous silicon film can be formed more easily than the polycrystalline silicon film and is therefore suitable to larger display sizes. Thus, the amorphous silicon TFT is suitably used in an active matrix substrate of a device of which a large area is demanded. In many active matrix substrates for liquid crystal television displays, the amorphous silicon TFT is used, notwithstanding it has a lower ON current than the polycrystalline silicon TFT.

However, when the amorphous silicon TFT is used, improvement in performance is limited because the mobility is low in the amorphous silicon film. Particularly, in recent years, improvement in display quality and reduction in power consumption as well as increase in display size have been highly demanded of liquid crystal display devices, such as liquid crystal television displays. The amorphous silicon TFT has a difficulty in sufficiently meeting such a demand.

To realize a TFT of higher performance with a reduced number of fabrication steps and a reduced fabrication cost, uses of other materials than amorphous silicon and polycrystalline silicon for the material of the active layer have been attempted. Patent Document 1, Patent Document 2, and Non-patent Document 1 propose that a microcrystalline silicon (μc-Si) film is used to form an active layer of a TFT. Such a TFT is called "microcrystalline silicon TFT".

The microcrystalline silicon film is a silicon film which contains microcrystalline grains in its inside. The grain boundary of the microcrystalline grains is mainly composed of an amorphous phase. Specifically, the grain boundary is in a state where the microcrystalline grains and the amorphous phase are mixed. The size of each microcrystalline grain is smaller than the size of the crystal grains contained in the polycrystalline silicon film. Also, as will be described in detail later, in the microcrystalline silicon film, each microcrystalline grain has the shape of, for example, a column grown from the substrate surface.

The microcrystalline silicon film can be formed only by a film formation step with the use of a plasma CVD method. As the material gas, a silane gas diluted with a hydrogen gas can be used. In the case of forming a polycrystalline silicon film, after formation of an amorphous silicon film with the use of a CVD apparatus or the like, the step of crystallizing the amorphous silicon film by laser or heat (annealing step) is necessary. On the other hand, in the case of forming a microcrystalline silicon film, a microcrystalline silicon film which includes a basic crystalline phase can be formed by a CVD apparatus or the like, and thus, the annealing step with laser or heat can be omitted. Since the microcrystalline silicon film thus can be formed by a smaller number of steps than that required for the formation of the polycrystalline silicon film, the microcrystalline silicon TFT can be fabricated with substantially the same degree of productivity as that of the amorphous silicon TFT, i.e., with substantially the same number of steps and substantially the same fabrication cost. Also, a microcrystalline silicon TFT can be fabricated using an apparatus designed for fabrication of the amorphous silicon TFT.

Since the microcrystalline silicon film has a higher mobility than the amorphous silicon film, using the microcrystalline silicon film can realize a higher ON current than the amorphous silicon TFT. Since the microcrystalline silicon film can be formed without complicated steps as required in the formation of the polycrystalline silicon film, larger areas can easily be realized.

Patent Document 1 describes using a microcrystalline silicon film as the active layer of a TFT, whereby the ON current achieved is 1.5 times that achieved in an amorphous silicon TFT. Non-patent Document 1 describes using a semiconductor film composed of microcrystalline silicon and amorphous silicon, whereby a TFT is obtained in which the ON/OFF current ratio is $10^6$, the mobility is about 1 $cm^2/Vs$, and the threshold is about 5 V. This value of the mobility is equal to or greater than that of the amorphous silicon TFT. Note that the TFT described in Non-patent Document 1 includes an amorphous silicon layer which is provided on a microcrystalline silicon layer in order to reduce the OFF current.

Patent Document 2 discloses an inverted staggered TFT in which microcrystalline silicon is used.

Patent Document 1: Japanese Laid-Open Patent Publication No. 6-196701

Patent Document 2: Japanese Laid-Open Patent Publication No. 5-304171

Non-patent Document 1: Zhongyang Xu et al., "A Novel Thin-film Transistors With μc-Si/a-Si Dual Active Layer Structure For AM-LCD" IDW'96 Proceedings of The Third International Display Workshops VOLUME 1, 1996, pp. 117-120.

SUMMARY OF INVENTION

Problems to be Solved by the Invention

According to the researches by the inventors of the present invention, in the conventional microcrystalline silicon TFTs such as those described in Patent Document 1 and Patent Document 2, a higher mobility and a higher ON current are obtained than in the amorphous silicon TFT, but the OFF current is extremely larger than that of the amorphous silicon TFT. As such, if the microcrystalline silicon TFT is used as a switching element in a liquid crystal display device, there is a probability that the pixel potential cannot be sufficiently held. If it is used in a peripheral circuit, such as a driver of a liquid crystal display device or the like, it sometimes becomes difficult to keep the power consumption at low levels.

The present invention was conceived in view of the above problems. One of the objects of the present invention is to provide a semiconductor device in which the OFF current is reduced while the mobility and the ON current are secured.

Means for Solving the Problems

A semiconductor device of the present invention includes: a substrate; an active layer provided on the substrate, the active layer including a channel region and first and second regions that are respectively located on opposite sides of the channel region; a first contact layer and a second contact layer which are respectively in contact with the first region and the second region of the active layer; a first electrode electrically coupled to the first region via the first contact layer; a second electrode electrically coupled to the second region via the second contact layer; and a gate electrode which is provided such that a gate insulating layer is interposed between the gate electrode and the active layer, the gate electrode being configured to control a conductivity of the channel region, wherein the active layer contains silicon, the semiconductor device further includes an oxygen-containing silicon layer between the active layer and the first and second contact layers, and the oxygen-containing silicon layer contains oxygen at a concentration higher than the active layer and the first and second contact layers.

In a preferred embodiment, the active layer is constituted of a microcrystalline silicon film which contains a crystal grain and an amorphous phase.

Preferably, a volume fraction of the amorphous phase in the microcrystalline silicon film is not less than 5% and not more than 95%.

Preferably, the oxygen-containing silicon layer contains the oxygen at a concentration higher than $1 \times 10^{20}$ atoms/cm$^3$.

The oxygen-containing silicon layer may be a surface oxide film of the active layer.

The gate electrode may be provided between the active layer and the substrate.

The semiconductor device may have a channel protection type structure.

An active matrix substrate of the present invention includes any of the above-described semiconductor devices. A display device of the present invention includes any of the above-described semiconductor devices.

A semiconductor device fabrication method of the present invention includes the steps of: (A) forming a gate electrode on a substrate; (B) forming a gate insulating layer so as to cover the gate electrode; (C) forming an active layer on the gate insulating layer, the active layer containing silicon; (D) forming an oxygen-containing silicon layer at least on first and second regions located on opposite sides of part of the active layer which is to be a channel region; (E) forming a first contact layer and a second contact layer, the first contact layer being electrically coupled to the first region via the oxygen-containing silicon layer, and the second contact layer being electrically coupled to the second region via the oxygen-containing silicon layer; and (F) forming a source electrode and a drain electrode, the source electrode being electrically coupled to the first contact layer, and the drain electrode being electrically coupled to the second contact layer.

In a preferred embodiment, the step (C) includes the steps of (C1) forming a microcrystalline silicon film, and (C2) patterning the microcrystalline silicon film to form the active layer.

In a preferred embodiment, the step (D) includes the step of oxidizing a surface of the microcrystalline silicon film or the active layer to form an oxygen-containing silicon layer over the microcrystalline silicon film or the active layer.

In a preferred embodiment, the step (D) includes the steps of (D1) forming an oxygen-containing silicon film over the microcrystalline silicon film, and (D2) patterning the oxygen-containing silicon film to form the oxygen-containing silicon layer, and the step (C1) and the step (D1) are performed in succession in a same chamber.

In a preferred embodiment, the step (D) includes the steps of (D1) forming an oxygen-containing silicon film over the microcrystalline silicon film, and (D2) patterning the oxygen-containing silicon film to form the oxygen-containing silicon layer, the step (E) includes the steps of (E1) forming a semiconductor film for formation of a contact layer on the oxygen-containing silicon film or the oxygen-containing silicon layer, and (E2) patterning the semiconductor film to form the first and second contact layers, and the step (E2) includes the step of etching the semiconductor film using the oxygen-containing silicon film or the oxygen-containing silicon layer as an etch stop layer.

In a preferred embodiment, the method further includes, between the step (C) and the step (E), the step of forming an etch stop layer so as to cover at least part of the active layer which is to be a channel region, wherein the step (D) includes the step of forming the oxygen-containing silicon layer on part of the active layer which is not covered with the etch stop layer.

Effects of the Invention

According to the present invention, an oxygen-containing silicon layer is provided between an active layer and a contact layer, whereby the OFF current can be reduced without decreasing the mobility and the ON current. Thus, a thin film transistor can be obtained in which the ON/OFF current ratio is higher than that of a conventional device.

By applying the present invention to a microcrystalline silicon TFT, a TFT can advantageously be obtained which has a high ON/OFF current ratio and which is excellent in productivity.

According to a semiconductor device fabrication method of the present invention, a thin film transistor of a high ON/OFF current ratio can be fabricated without increasing the number of fabrication steps or the fabrication cost. Particularly, when the present invention is applied to fabrication of a microcrystalline silicon TFT, the productivity and the TFT characteristics can be improved more effectively.

In the case where the present invention is applied to a channel etching type thin film transistor, performing channel etching with the use of an oxygen-containing silicon layer as an etch stop layer can decrease damages to the active layer which would be caused by the channel etching. Therefore, the variations in characteristics of the active layer across the substrate plane can be decreased, and the performance and reliability of the thin film transistor can be improved.

Figure 1:
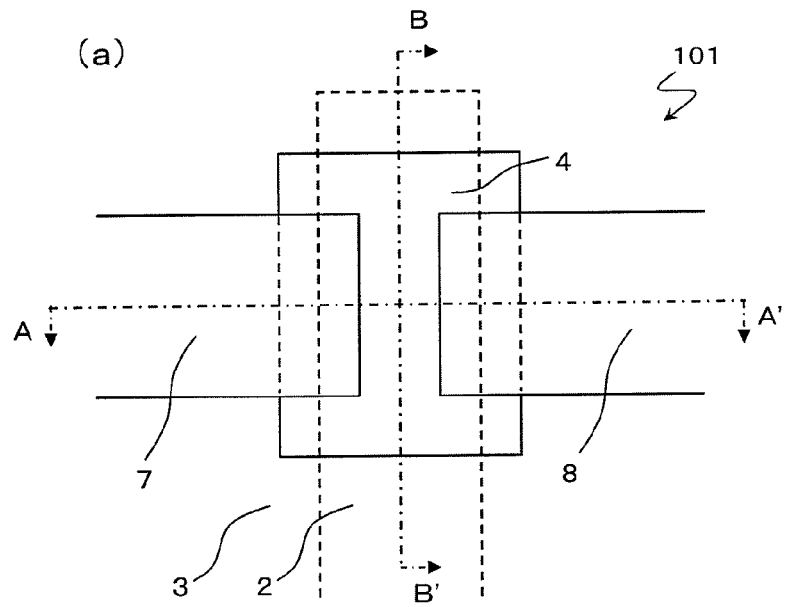
FIG. 1 (a) to (c) are diagrams schematically showing a semiconductor device of embodiment 1 of the present invention. (a) is a plan view. (b) and (c) are cross-sectional views respectively taken along line A-A' and line B-B' of (a).
Figure 1:
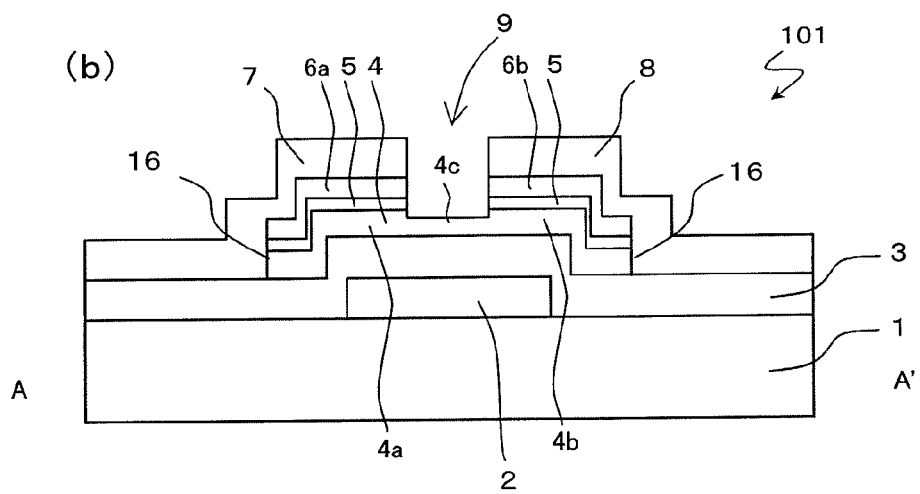
Figure 1:
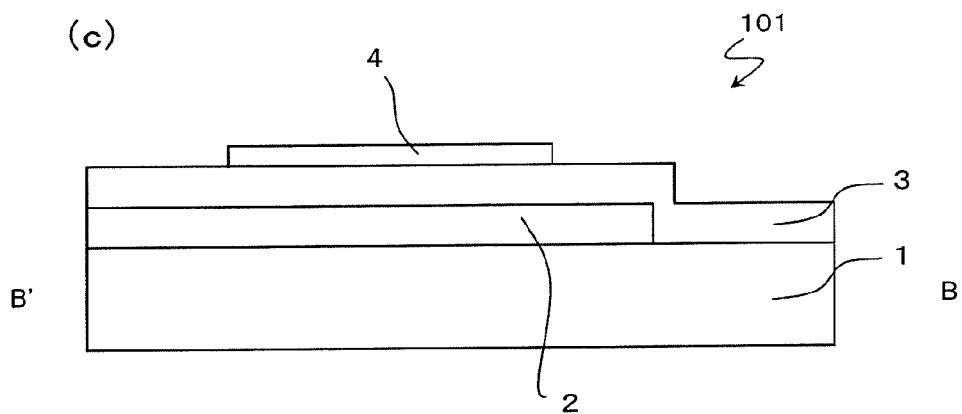

DESCRIPTION OF THE REFERENCE NUMERALS 1 substrate
2 gate electrode
3 gate insulating layer
4, 74 microcrystalline silicon layer
4a, 4b, 74a, 74b region of microcrystalline silicon layer
4c channel region of microcrystalline silicon layer
5 oxygen-containing silicon layer
6a, 6b contact layer
7 source electrode
8 drain electrode
9 gap
10 microcrystalline silicon film
11 oxygen-containing silicon film
12 n$^+$ type silicon film
10' microcrystalline silicon processed film
11' oxygen-containing silicon processed film
12' n$^+$ type silicon processed film
15 resist pattern film
16, 19 side wall
17 etch stop layer
18 silicon nitride film
40 silicon layer
40L lower layer
40U upper layer
40a, 40b region of silicon layer
40c channel region of silicon layer
72 recess
78 passivation film
79 planarizing film
80 transparent electrode
101, 102, 103, 104, 105, 106, 107, 108 semiconductor device
201, 202 semiconductor device

DETAILED DESCRIPTION OF THE INVENTION

The present invention relates to a semiconductor device which includes an active layer containing silicon, source and drain electrodes, and first and second contact layers respectively provided between the active layer and the source and drain electrodes, characterized in that the semiconductor device further includes an oxygen-containing silicon layer between the active layer and the first and second contact layers. The "oxygen-containing silicon layer" refers to a layer which is composed of a material containing silicon and which contains oxygen at a concentration higher than the active layer and the first and second contact layers. Thus, any other material may be contained in addition to the silicon and the oxygen.

According to the present invention, the oxygen-containing silicon layer provided between the active layer and the first and second contact layers serves as a resistor, so that the OFF current can be reduced. On the other hand, the ON current is scarcely reduced by the oxygen-containing silicon layer. As a result, the ON/OFF current ratio (the ratio of the ON current to the OFF current; hereinafter, simply "ON/OFF ratio") of the semiconductor device can be improved.

The oxygen concentration in the oxygen-containing silicon layer is preferably not less than $1 \times 10^{20}$ atoms/cm$^3$. This ensures the reduction of the OFF current of the semiconductor device. More preferably, the oxygen concentration in the oxygen-containing silicon layer is not less than $1 \times 10^{21}$ atoms/cm$^3$. If the oxygen concentration is not less than $1 \times 10^{21}$ atoms/cm$^3$, the electric resistance of the oxygen-containing silicon layer abruptly increases, so that the OFF current can be greatly reduced, and the ON/OFF ratio can be effectively increased. On the other hand, if the oxygen concentration exceeds $1 \times 10^{23}$ atoms/cm$^3$, the electric resistance of the oxygen-containing silicon layer is too high, so that there is a probability that the operation of the semiconductor device will be hindered. Thus, the oxygen concentration is preferably not more than $1 \times 10^{23}$ atoms/cm$^3$. Note that the oxygen concentration in the oxygen-containing silicon layer can be measured by, for example, secondary ion mass spectrometry (SIMS).

The thickness of the oxygen-containing silicon layer is, for example, preferably not less than 1 nm and not more than 30 nm, although it depends on the oxygen concentration of the oxygen-containing silicon layer. If it is not less than 1 nm, the OFF current can more surely be reduced. On the other hand, if it exceeds 30 nm, the electric resistance of the oxygen-containing silicon layer is too large so that there is a probability that the ON current will disadvantageously decrease.

The oxygen-containing silicon layer may be a surface oxide film of the active layer. This eliminates the necessity of a film formation apparatus for the formation of the oxygen-containing silicon layer, thus improving the productivity of the semiconductor device. Alternatively, the oxygen-containing silicon layer may be a deposited film which is formed by CVD on the active layer. In this case, when the active layer and the oxygen-containing silicon layer are formed in succession using a plasma CVD apparatus, for example, the number of fabrication steps can advantageously be reduced.

The active layer preferably contains a microcrystalline silicon film. In a conventional microcrystalline silicon TFT which uses a microcrystalline silicon film as an active layer, the mobility of the active layer is high so that the ON current can be increased. However, the OFF current also increases at the same time, so that an excellent ON/OFF ratio cannot be obtained. On the other hand, when the present invention is applied to a microcrystalline silicon TFT, the OFF current can be reduced while securing the ON current, so that the ON/OFF ratio can particularly effectively improved.

Now, the microcrystalline silicon film is described in detail.

The microcrystalline silicon film has a structure which mixedly contains a crystalline silicon phase and an amorphous silicon phase. The volume fraction of the amorphous phase in the microcrystalline silicon film can be controlled within the range of not less than 5% and not more than 95%, for example. The volume fraction of the amorphous phase is preferably not less than 5% and not more than 40%, so that the ON/OFF ratio of the TFT can effectively be improved. When Raman scattering spectrometry with visible light is performed on the microcrystalline silicon film, the resultant spectrum has the highest peak at the wavelength of 520 cm$^{-1}$, which is the peak of the crystalline silicon, and has a broad peak at the wavelength of 480 cm$^{-1}$, which is the peak of the amorphous silicon. The height of the peak of the amorphous silicon near 480 cm$^{-1}$ is, for example, not less than 1/30 and not more than 1 of the height of the peak of the crystalline silicon near 520 cm$^{-1}$.

For comparison purposes, Raman scattering spectrometry is performed on a polycrystalline silicon film, and an amorphous component is scarcely detected, the height of the peak of the amorphous silicon being substantially zero.

When forming a polycrystalline silicon film, the amorphous phase can be locally left under some crystallization conditions. Even in such a case, the volume fraction of the amorphous phase in the polycrystalline silicon film is less than about 5%, so that the height of the peak of the amorphous silicon in the Raman scattering spectrometry is less than about 1/30 of the height of the peak of the polycrystalline silicon.

Such a microcrystalline silicon film can be formed by high density plasma CVD of, for example, CCP (capacitively-coupled plasma) type or ICP (inductively-coupled plasma) type. The above-described peak intensity ratio can be adjusted by modifying the plasma CVD conditions.

Hereinafter, the structure of a microcrystalline silicon film which is preferably used in an embodiment of the present invention is described with reference to the drawings by means of comparison with the structures of a polycrystalline silicon film and an amorphous silicon film.

Figure 21:
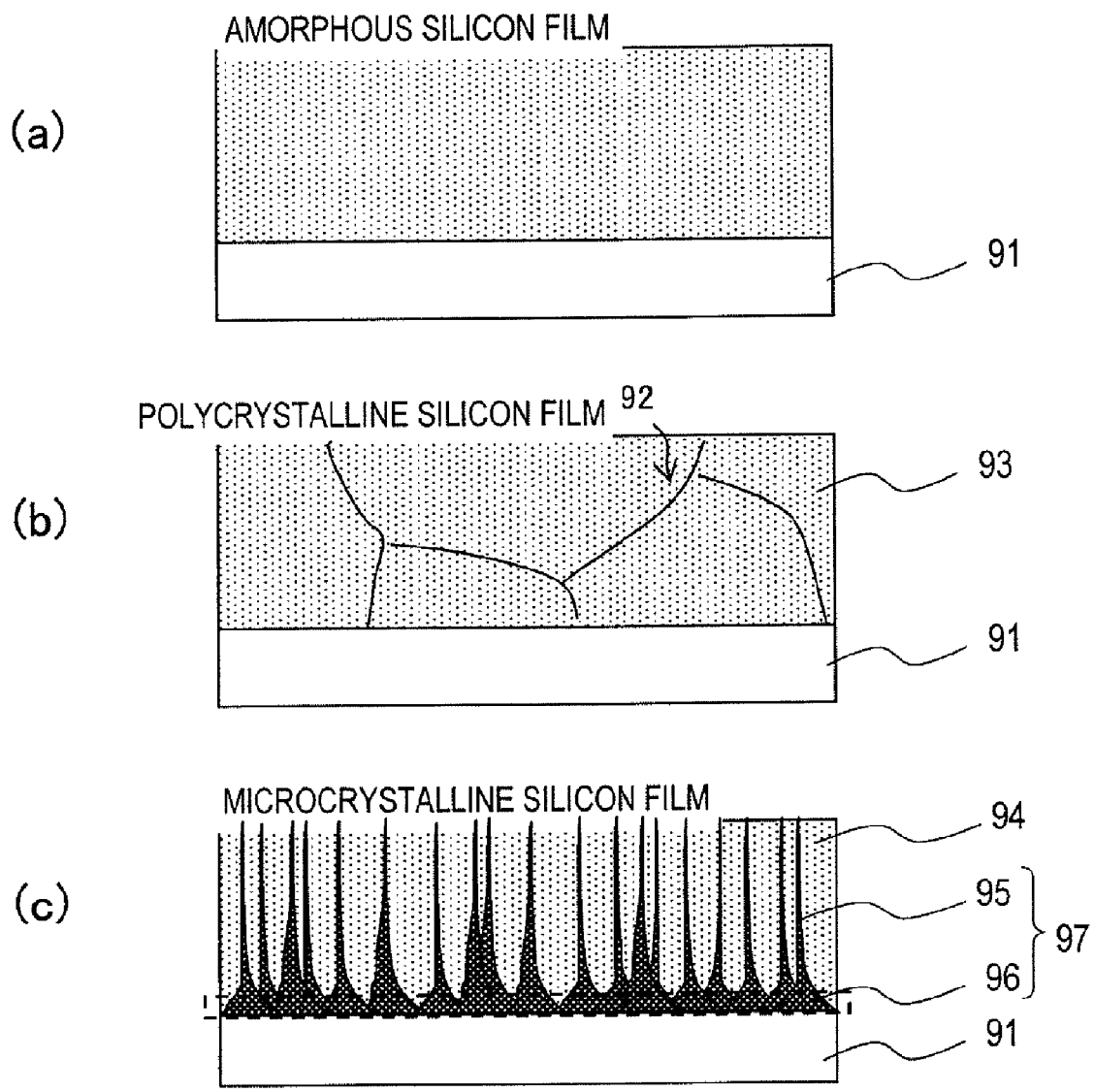
FIG. 21 (a) to (c) are enlarged schematic cross-sectional views showing examples of an amorphous silicon film, a polycrystalline silicon film, and a microcrystalline silicon film, respectively.

FIGS. 21(a) to 21(c) are schematic cross-sectional views showing examples of an amorphous silicon film, a polycrystalline silicon film, and a microcrystalline silicon film, respectively.

The amorphous silicon film is composed of an amorphous phase as shown in FIG. 21(a). The amorphous silicon film of this type is generally formed by, for example, plasma CVD on a substrate 91.

The polycrystalline silicon film is composed of a plurality of crystal grains 93 which are defined by grain boundaries 92 as shown in FIG. 21(b). The polycrystalline silicon film is composed of crystalline silicon in almost all the part. The volume fraction of the grain boundaries 92 in the polycrystalline silicon film is extremely small. The polycrystalline silicon film is obtained by, for example, performing a crystallization step with laser or heat on the amorphous silicon film formed on the substrate 91.

The microcrystalline silicon film includes microcrystalline grains 94 and grain boundaries 95 composed of an amorphous phase as shown in FIG. 21(c). The substrate side of the microcrystalline silicon film is provided with a thin amorphous layer (hereinafter, "incubation layer") 96. In this example, the grain boundaries 95 and the incubation layer 96 constitute an "amorphous phase" 97 of the microcrystalline silicon film. The plurality of microcrystalline grains 94 constitute a "crystalline silicon phase".

In the example shown in FIG. 21(c), each of the microcrystalline grains 94 has a columnar shape extending in the thickness direction of the microcrystalline silicon film, from the top of the incubation layer 96 to the upper surface of the microcrystalline silicon film. Such a microcrystalline silicon film can be formed by substantially the same plasma CVD method as that employed in the fabrication method of the amorphous silicon film with the use of, for example, a silane gas diluted with a hydrogen gas as a source material gas.

The microcrystalline grains 94 are smaller than the crystal grains 93 of the polycrystalline silicon film (FIG. 21(b)). Observing a cross section of the microcrystalline silicon film with the use of a transmission electron microscope (TEM), the average grain size of the microcrystalline grains 94 is not less than 2 nm and not more than 300 nm. Therefore, the crystalline cross section of the microcrystalline grains 94 is sufficiently small as compared with the size of the semiconductor device, so that the characteristics of the semiconductor device can be made uniform.

The incubation layer 96 grows more readily in the early part of the formation of the microcrystalline silicon film. The thickness of the incubation layer 96 is, for example, several nanometers although it depends on the formation conditions of the microcrystalline silicon film. Note that, under some formation conditions or in some formation methods of the microcrystalline silicon film, e.g., particularly in the case of using high density plasma CVD, the incubation layer 96 may scarcely be detected.

In the microcrystalline silicon film shown in FIG. 21(c), each of the microcrystalline grains 94 has a columnar shape extending in a direction generally normal to the substrate 91. However, the structure of the microcrystalline silicon film depends on the method and conditions of the formation of the microcrystalline silicon film and is not limited to the shown structure. Note that, however, the volume fraction of the amorphous phase in the microcrystalline silicon film and the peak intensity ratio (the ratio of the peak height of the amorphous silicon to the peak height of the crystalline silicon) are preferably within the ranges identified above irrespective of the structure of the microcrystalline silicon film. If so, a TFT with high ON characteristics can be realized.

The present invention is particularly suitably applicable to a microcrystalline silicon TFT of a channel etching type. Conventionally, there has been a problem that, if a channel etching type TFT is formed using a microcrystalline silicon film, microcrystalline silicon is readily damaged by channel etching, and variations in characteristics, such as mobility, etc., across the substrate plane readily occur due to the variation in the etching rate across the substrate plane. On the other hand, the present embodiment utilizes the oxygen-containing silicon layer as an etch stop layer so that the first and second contact layers can be selectively etched. Therefore, the variations in characteristics across the substrate plane can be reduced. Thus, the characteristics and reliability, as well as productivity, of the microcrystalline silicon TFT can be improved.

The semiconductor device of the present embodiment may preferably be a microcrystalline silicon TFT which has a bottom gate structure. Since many of the conventional amorphous silicon TFTs have a bottom gate structure, the manufacturing equipment and facility for use in fabrication of the conventional amorphous silicon TFTs can be diverted to fabrication of the microcrystalline silicon TFT of this type, thus realizing a highly productive process.

The semiconductor device of the present invention is applicable to a wide variety of uses, including circuit substrates, such as active matrix substrates, display devices which include such a circuit substrate, such as liquid crystal display devices and organic electroluminescence display devices, and devices which include TFTs, such as imaging devices.

Embodiment 1

Hereinafter, embodiment 1 of the semiconductor device of the present invention is described with reference to the drawings. The semiconductor device of the present embodiment is a microcrystalline silicon TFT in which the active layer is a microcrystalline silicon film.

FIG. 1 schematically shows a structure of the semiconductor device of the present embodiment. FIG. 1(a) is a plan view of the semiconductor device. FIG. 1(b) is a cross-sectional view taken along line A-A' of FIG. 1(a). FIG. 1(c) is a cross-sectional view taken along line B-B' of FIG. 1(a).

The semiconductor device 101 is an inverted staggered channel etching type TFT which has a bottom gate structure. The semiconductor device 101 includes a substrate 1, such as a glass substrate, a gate electrode 2 provided on the substrate 1, a gate insulating layer 3 provided on the substrate 1 so as to cover the gate electrode 2, a microcrystalline silicon layer 4 provided on the gate insulating layer 3, an oxygen-containing silicon layer 5, the contact layers 6a, 6b, and a source electrode 7 and a drain electrode 8 provided on the contact layers 6a, 6b. The microcrystalline silicon layer 4 functions as an active layer and includes a channel region 4c and first and second regions 4a, 4b provided on opposite sides of the channel region 4c. The first region 4a is electrically coupled to the source electrode 7 via the contact layer 6a. The second region 4b is electrically coupled to the drain electrode 8 via the contact layer 6b. The gate electrode 2 is located such that the gate insulating layer 3 is interposed between the gate electrode 2 and the microcrystalline silicon layer 4. The gate electrode 2 controls the conductivity of the channel region 4c. The oxygen-containing silicon layer 5 is provided between the microcrystalline silicon layer 4 and the contact layers 6a, 6b. In the present embodiment, the oxygen-containing silicon layer 5, the contact layers 6a, 6b, the source electrode 7 and the drain electrode 8 are patterned so as not to extend over the channel region 4c, whereby a gap 9 is formed over the channel region 4c.

The microcrystalline silicon layer 4 includes a plurality of columnar microcrystalline grains and grain boundaries composed of the amorphous phase as previously described with reference to FIG. 21(c). The volume fraction of the amorphous phase in the microcrystalline silicon layer 4 is, for example, not less than 5% and not more than 40%. The height of the peak of the amorphous phase which is detected by the Raman scattering spectrometry is 1/10 to 1/3 of the height of the peak of the microcrystalline part. Note that, instead of the microcrystalline silicon layer 4, an amorphous silicon layer or polycrystalline silicon layer may be used as the active layer.

The contact layers 6a, 6b are provided for the purpose of improving the electric conduction between the microcrystalline silicon layer 4 and the source electrode 7 and drain electrode 8. For example, the contact layers 6a, 6b are made of $n^+$ type silicon. Note that the contact layers 6a, 6b may be a single layer, such as a polycrystalline silicon layer, a microcrystalline silicon layer, or an amorphous silicon layer, or may have a layered structure including at least one of these layers.

In the semiconductor device 101, a current flows between the source electrode 7 and the drain electrode 8. For example, when a current flows in a direction from the source electrode 7 to the drain electrode 8, this current comes out of the source electrode 7 and flows through the contact layer 6a and the oxygen-containing silicon layer 5, and then flows through the channel region 4c of the microcrystalline silicon layer 4. Thereafter, the current flows through the oxygen-containing silicon layer 5 again and through the contact layer 6b to reach the drain electrode 8. Thus, in the midst of the route of the current flowing between the source electrode 7 and the drain electrode 8, the oxygen-containing silicon layer 5 is provided which has a higher resistance than the microcrystalline silicon layer 4. In this arrangement, in an OFF state, the oxygen-containing silicon layer 5 itself serves as a resistor so that the OFF current can be reduced. On the other hand, in an ON state, due to the voltage applied to the gate electrode 2, mobile charges are collected in the microcrystalline silicon layer 4. Thus, the current between the source electrode 7 and the microcrystalline silicon layer 4 and the current between the drain electrode 8 and the microcrystalline silicon layer 4 can flow with a low resistance due to the tunnel effect and are not greatly affected by the resistance of the oxygen-containing silicon layer 5. Therefore, the ON/OFF ratio can be greatly improved as compared with the conventional devices. Note that, in the case where a current flows from the drain electrode 8 to the source electrode 7, the above description also applies to this case although the route is opposite to the above.

In the present embodiment, the microcrystalline silicon layer 4, which has a higher mobility than the amorphous silicon layer, is used as the active layer, and therefore, a larger ON current is allowed to flow than in the conventional amorphous silicon TFT, so that excellent ON characteristics can be obtained.

Although not shown, as in a common TFT, a passivation film may be provided over the source electrode 7 and the drain electrode 8 so as to cover the gap 9 and its surroundings. The passivation film may be a film of an inorganic material, such as silicon nitride, or an organic film, such as an acrylic resin, or may be a layered structured constituted of these films. In the present embodiment and other embodiments which will be described later, a semiconductor device example described does not include such a passivation film. A semiconductor device which has a passivation film is within the extent of the semiconductor device of the present invention.

In the present embodiment and other embodiments which will be described later, the oxygen-containing silicon layer 5 is in contact with the microcrystalline silicon layer and the contact layers 6a, 6b. However, the oxygen-containing silicon layer 5 may be provided in the midst of the current route between the source electrode 7 and the drain electrode 8 and may not be in contact with the microcrystalline silicon layer 4 and the contact layers 6a, 6b. For example, an amorphous silicon layer may be provided between the oxygen-containing silicon layer 5 and the microcrystalline silicon layer 4. Likewise, an amorphous silicon layer may be provided between the oxygen-containing silicon layer 5 and the contact layers 6a, 6b.

Although the microcrystalline silicon layer 4 described herein is a single layer, the microcrystalline silicon layer 4 may have a layered structure. The active layer of the semiconductor device 101 does not need to be composed only of the microcrystalline silicon layer 4. For example, the active layer may have a layered structure constituted of a microcrystalline silicon layer and an amorphous silicon layer. The gate electrode 2, the source electrode 7 and the drain electrode 8 do not need to be constituted of a single conductor layer, such as a metal layer. They may have a layered structure constituted of layers of an identical conductor or layers of different conductors.

The substrate 1 may be an insulator substrate which is different from the glass substrate, for example, a plastic substrate, or the like. Alternatively, the substrate 1 may be a stainless substrate which has an insulation film over its surface. Note that the substrate 1 may not be a transparent substrate.

Although not shown, when necessary, the gate insulating layer 3 may have an opening through which an electric signal, such as a predetermined voltage, is input to the gate electrode 2. Therefore, a semiconductor device having such an opening that is formed photolithographically, for example, is also within the extent of the semiconductor device of the present invention. The gate electrode 2, the source electrode 7 and the drain electrode 8 may be appropriately coupled to external devices by means of openings and wires so as to receive electric signals from the external devices.

<Fabrication Method of Semiconductor Device 101>

Next, an example of the fabrication method of the semiconductor device 101 of the present embodiment is described with reference to the drawings.

Figure 2:
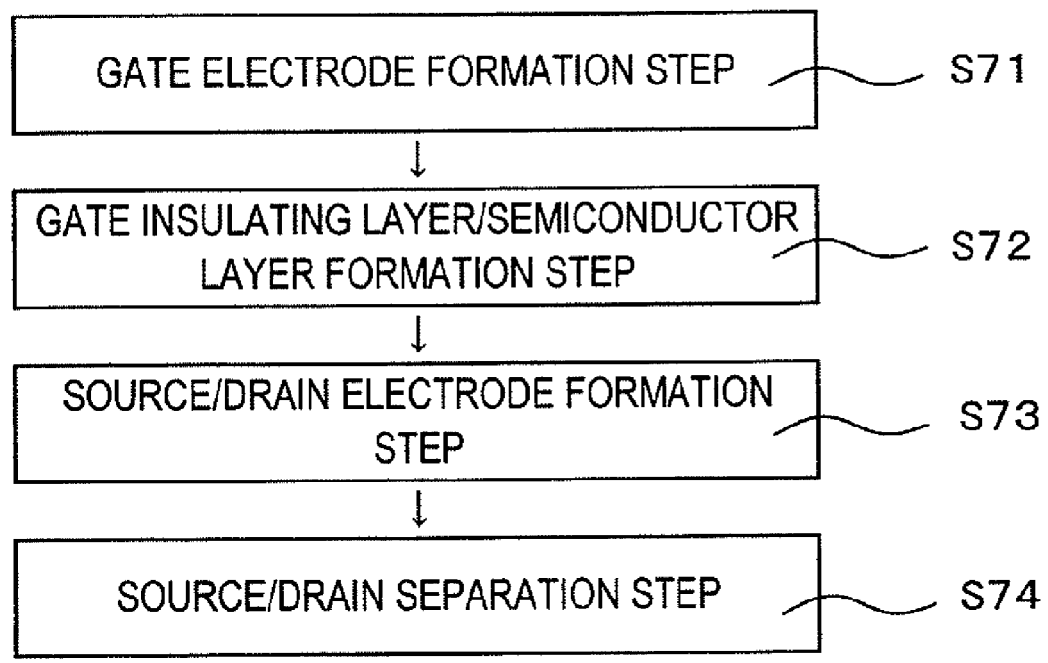
FIG. 2 A flowchart for illustrating an example of the fabrication method of the semiconductor device of embodiment 1 of the present invention.

FIG. 2 is a flowchart for illustrating a general procedure of the fabrication method of the present embodiment. As shown in FIG. 2, the fabrication method of the semiconductor device 101 includes gate electrode formation step S71 for forming a gate electrode, gate insulating layer/semiconductor layer formation step S72 for forming a gate insulating layer and an island-like semiconductor layer which serves as an active layer, source/drain electrode formation step S73 for forming source and drain electrodes, and source/drain separation step S74 for electrically separating the source and drain electrodes.

Figure 3:
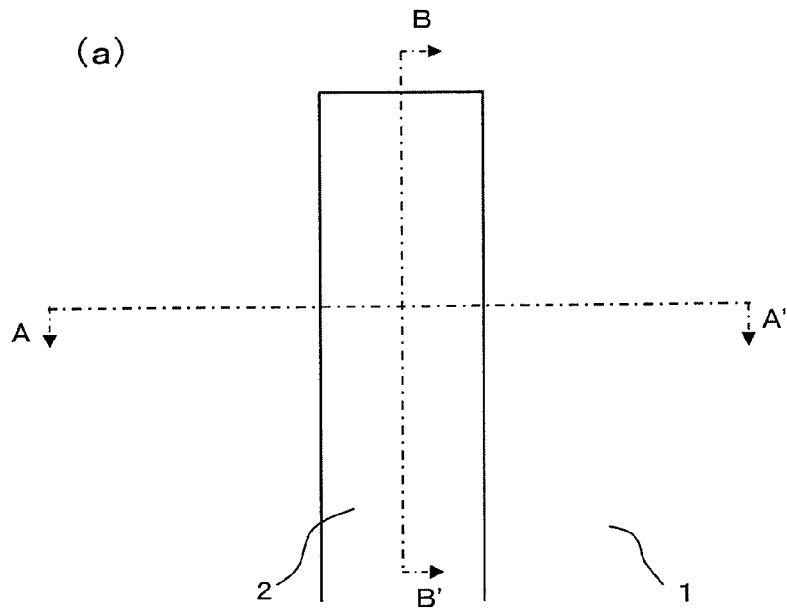
FIG. 3 (a) to (c) are diagrams for illustrating a fabrication step of the semiconductor device of embodiment 1 of the present invention. (a) is a plan view. (b) and (c) are cross-sectional views respectively taken along line A-A' and line B-B' of (a).
Figure 3:
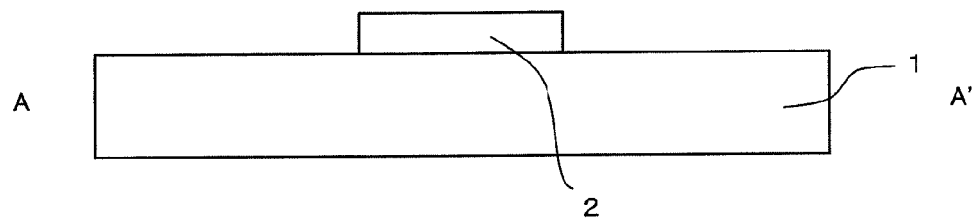
Figure 3:
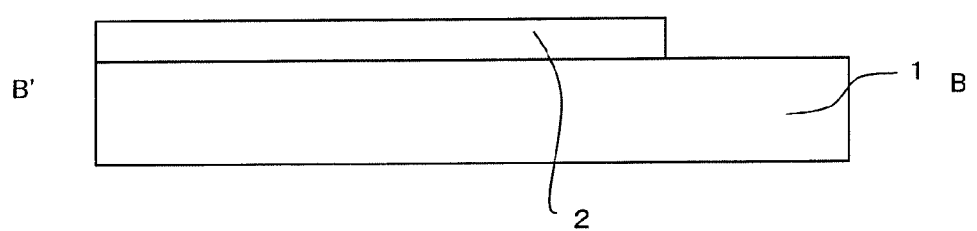

Hereinafter, the fabrication method is described in detail step by step with reference to FIG. 3 to FIG. 6. FIG. 3 to FIG. 6 are diagrams of the steps for illustrating the fabrication method of the semiconductor device 101. FIG. 3(*a*) is a plan view. FIG. 3(*b*) is a cross-sectional view taken along line A-A' of FIG. 3(*a*). FIG. 3(*c*) is a cross-sectional view taken along line B-B' of FIG. 3(*a*). The same applies to FIG. 4 to FIG. 6. In each of these drawings, (*a*) is a plan view, (*b*) is a cross-sectional view taken along line A-A' of the corresponding plan view, and (*c*) is a cross-sectional view taken along line B-B' of the corresponding plan view.

(1) Gate Electrode Formation Step S71:

Referring to FIGS. 3(*a*) to 3(*c*), a gate metal film is formed on the substrate 1 and patterned to form the gate electrode 2. Specifically, first, molybdenum (Mo) is deposited on the substrate 1, such as a glass substrate to 0.2 μm thick by sputtering using an argon (Ar) gas, thereby forming a gate metal film (not shown). During the formation of the gate metal film, the temperature of the substrate 1 is 200 to 300° C.

Then, a resist pattern film (not shown) is formed of a photoresist material on the gate metal film. The resist pattern film is used as a mask for patterning of the gate metal film (photolithography step). As a result, the gate electrode 2 is obtained. The etching of the gate metal film may be, for example, wet etching. The etchant used herein may be a solution that is composed of 10 to 80 weight % of phosphoric acid, 1 to 10 weight % of nitric acid, 1 to 10 weight % of acetic acid, and water that constitutes the remaining part of the solution. After the end of the etching, the resist pattern film is removed using a peeling solution which contains an organic alkali.

The material of the gate electrode 2 may be a material which contains, in addition to molybdenum (Mo), indium tin oxide (ITO), a simple metal of tungsten (W), copper (Cu), chromium (Cr), tantrum (Ta), aluminum (Al), titanium (Ti), or the like, a nitride or oxide of the simple metal, or an alloy of the simple metal which contains another metal. The gate electrode 2 may be a single layer made of the above material or may have a layered structure. For example, the gate electrode 2 may be a layered film containing titanium and aluminum, e.g., a Ti/Al/Ti layered film. Alternatively, it may be a layered film containing titanium and copper, e.g., a Ti/Cu/Ti layered film, or a layered film containing copper and molybdenum, e.g., a Mo/Cu/Mo layered film.

The formation method of the gate metal film may be a method different from sputtering, e.g., a deposition method. The thickness of the gate metal film is not limited to any particular thickness. The etching method of the gate metal film is not limited to the above-described wet etching. For example, dry etching may be employed using a combination of a chlorine ($Cl_2$) gas and a boron trichloride ($BCl_3$) gas, a carbon tetrafluoride ($CF_4$) gas, oxygen ($O_2$), etc.

Figure 4:
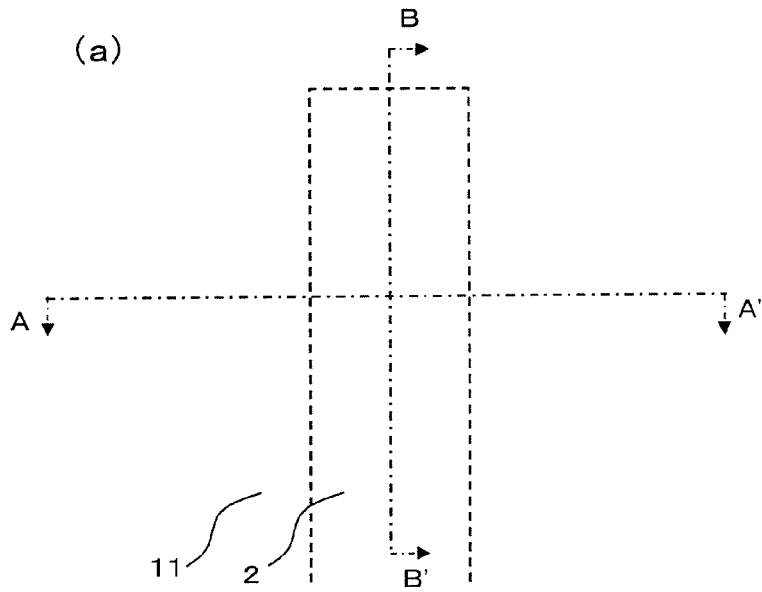
FIG. 4 (a) to (c) are diagrams for illustrating a fabrication step of the semiconductor device of embodiment 1 of the present invention. (a) is a plan view. (b) and (c) are cross-sectional views respectively taken along line A-A' and line B-B' of (a).
Figure 4:
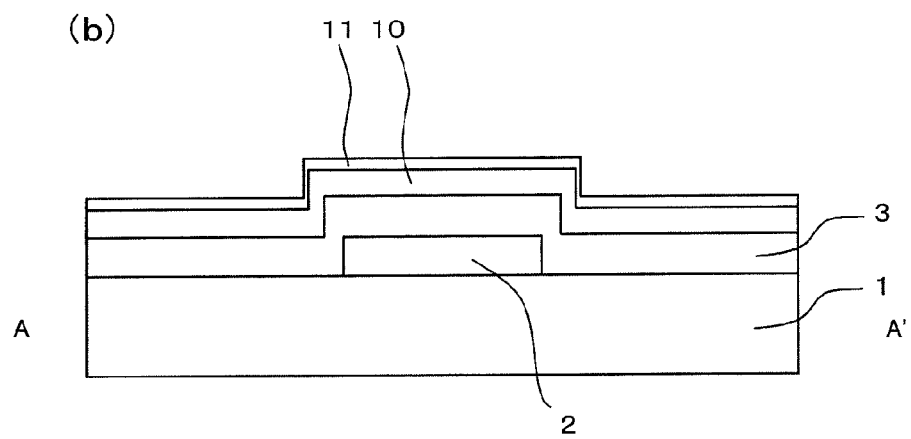
Figure 4:
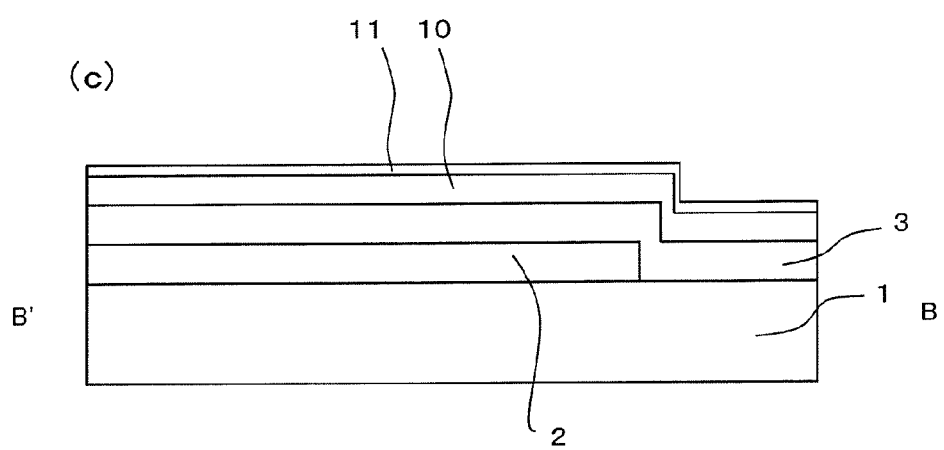

(2) Gate Insulating Layer/Semiconductor Layer Formation Step S72:

Next, referring to FIGS. 4(*a*) to 4(*c*), a gate insulating layer 3, a microcrystalline silicon film 10, and an oxygen-containing silicon film 11 are formed in this order on the gate electrode 2.

First, on the substrate 1 on which the gate electrode 2 has been formed, a gate insulating layer 3 (e.g., 0.4 μm thick) is formed of silicon nitride ($SiN_x$) by plasma enhanced chemical vapor deposition (PECVD). In the present embodiment, the formation of the gate insulating layer 3 is performed in a film formation chamber which has an electrode structure of a parallel plate type (capacitively-coupled type) under the conditions that the substrate temperature is 300° C., the pressure is 50 to 300 Pa, and the power density is 10 to 20 mW/cm². The gas used herein for the film formation is a mixture gas of silane ($SiH_4$), ammonia ($NH_3$), and nitrogen ($N_2$).

Then, a microcrystalline silicon film 10 (e.g., 0.12 μm thick) is formed using the same film formation chamber. In the present embodiment, the formation of the microcrystalline silicon film 10 is performed under the conditions that the substrate temperature is 250 to 300° C., the pressure is 50 to 300 Pa, and the power density is 5 to 30 mW/cm² with the use of a silane gas which is diluted with a hydrogen gas as the film formation gas. The flow rate ratio of silane ($SiH_4$) and hydrogen ($H_2$) is 1:200 to 1:1000.

Thereafter, the substrate 1 on which the microcrystalline silicon film 10 has been formed is removed out of the film formation chamber and exposed to air that contains oxygen. During the exposure, the substrate temperature is 15 to 30° C. The duration of the exposure to air is 24 to 48 hours. As a result, a surface of the microcrystalline silicon film 10 is oxidized to become a surface oxide film (oxygen-containing silicon film) 11. In the present embodiment, the thickness of the oxygen-containing silicon film 11 is 1 to 10 nm, and the oxygen concentration is $1\times10^{21}$ to $1\times10^{22}$ atoms/cm³. Note that the substrate temperature during the exposure to air, the duration of the exposure, etc., are not limited to the above-identified temperatures and durations, but may be appropriately selected. If a surface oxide film has been formed on the microcrystalline silicon film 10 before the formation of the oxygen-containing silicon film 11, the oxygen-containing silicon film 11 may be formed by the above-described method after the surface oxide film is once removed by using a hydrogen fluoride aqueous solution.

The formation method of the oxygen-containing silicon film 11 may be any method so long as it enables formation of a silicon film that contains oxygen. The surface oxide film of the microcrystalline silicon film 10 may be formed by, for example, a surface oxidizing method with the use of ozone, an oxidizing method with the use of oxygen plasma, or an oxidizing method with the use of an oxidizing agent. Alternatively, a film which contains oxygen and silicon, such as a silicon oxide film, may be formed on the microcrystalline silicon film 10 by PECVD, for example.

Figure 5:
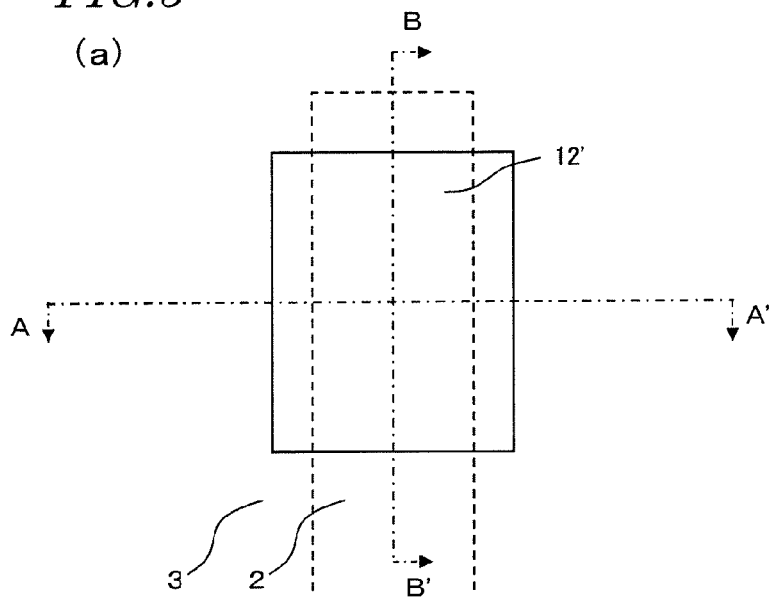
FIG. 5 (a) to (c) are diagrams for illustrating a fabrication step of the semiconductor device of embodiment 1 of the present invention. (a) is a plan view. (b) and (c) are cross-sectional views respectively taken along line A-A' and line B-B' of (a).
Figure 5:
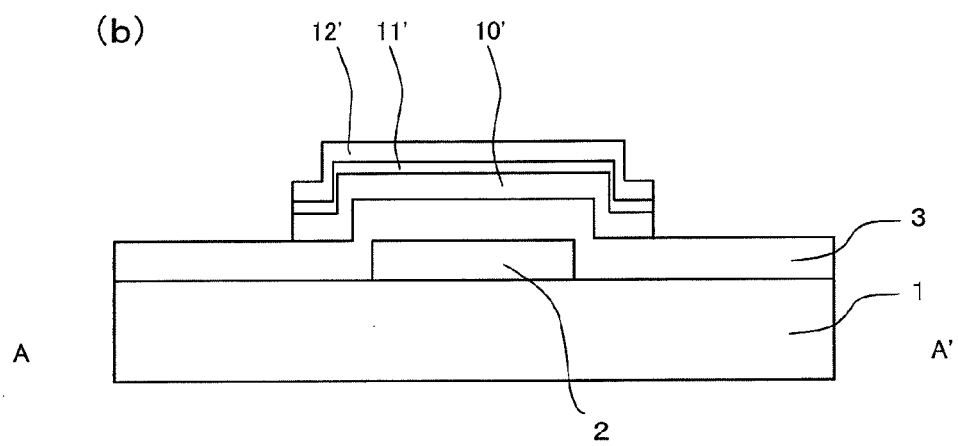
Figure 5:
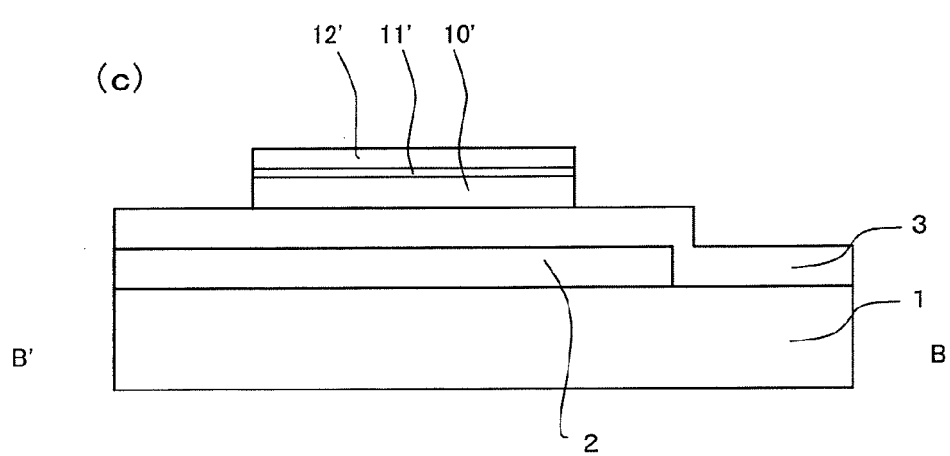

Subsequently, on the oxygen-containing silicon film 11, an n⁺ type silicon film (e.g., 0.05 μm thick) is formed, and thereafter, the microcrystalline silicon film 10, the oxygen-containing silicon film 11 and the n⁺ type silicon film are patterned by photolithography. As a result, as shown in FIGS. 5(*a*) to 5(*c*), an island-like microcrystalline silicon processed film 10', an oxygen-containing silicon processed film 11', and an n⁺ type silicon processed film 12' are obtained. These processed films 10', 11', and 12' have a pattern which covers the gate electrode 2 in a cross section taken along the channel direction as shown in FIG. 5(*b*).

The formation of the n⁺ type silicon film can be carried out using a PECVD method. In the present embodiment, the formation of the n⁺ type silicon film is carried out using a film formation chamber which has an electrode structure of a parallel plate type (capacitively-coupled type) under the conditions that the substrate temperature is 250 to 300° C., the pressure is 50 to 300 Pa, and the power density is 10 to 20 mW/cm². The gas used herein for the film formation is a mixture gas of silane ($SiH_4$), hydrogen ($H_2$), and phosphine ($PH_3$).

The patterning of the microcrystalline silicon film 10, the oxygen-containing silicon film 11, and the n⁺ type silicon film is performed using a resist pattern film formed on the n⁺ type silicon film as a mask (photolithography step). The etching method used herein is dry etching mainly using a chlorine ($Cl_2$) gas. Thereafter, the resist pattern film is removed using a peeling solution which contains an organic alkali.

(3) Source/Drain Electrode Formation Step S73:

On the n⁺ type silicon processed film 12' and the gate insulating layer 3, a conductive film for formation of source and drain electrodes is formed. In the present embodiment, molybdenum (Mo) is deposited by sputtering with the use of an argon (Ar) gas on a surface of the substrate 1 to 0.2 μm thick, whereby a conductive film (e.g., 0.2 μm thick) is formed. The substrate temperature during the formation of the conductive film is 200 to 300° C.

Figure 6:
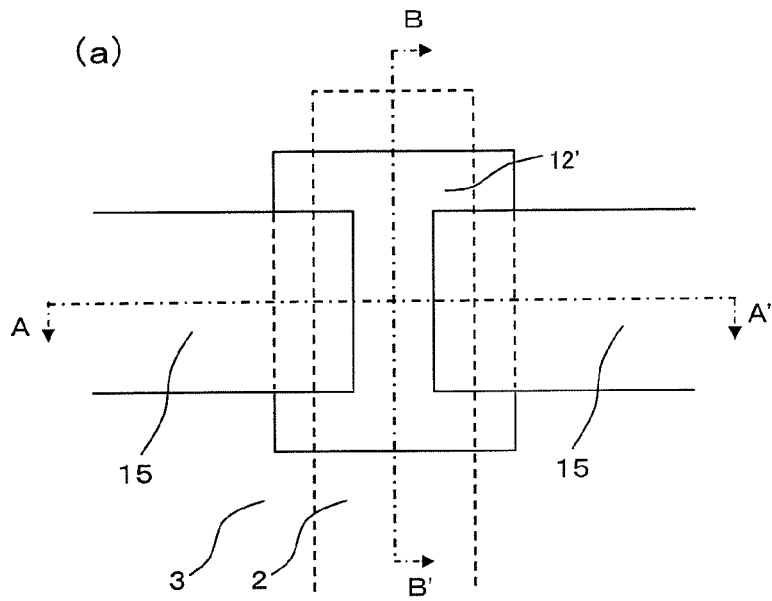
FIG. 6 (a) to (c) are diagrams for illustrating a fabrication step of the semiconductor device of embodiment 1 of the present invention. (a) is a plan view. (b) and (c) are cross-sectional views respectively taken along line A-A' and line B-B' of (a).
Figure 6:
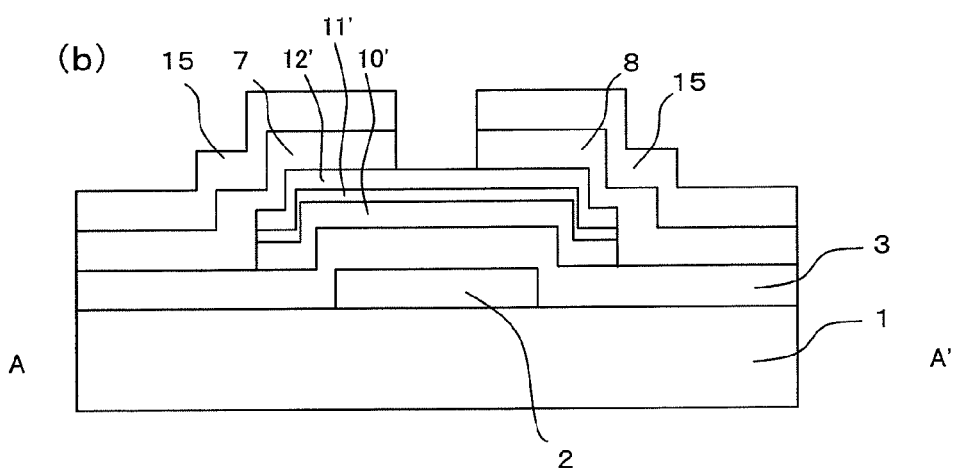
Figure 6:
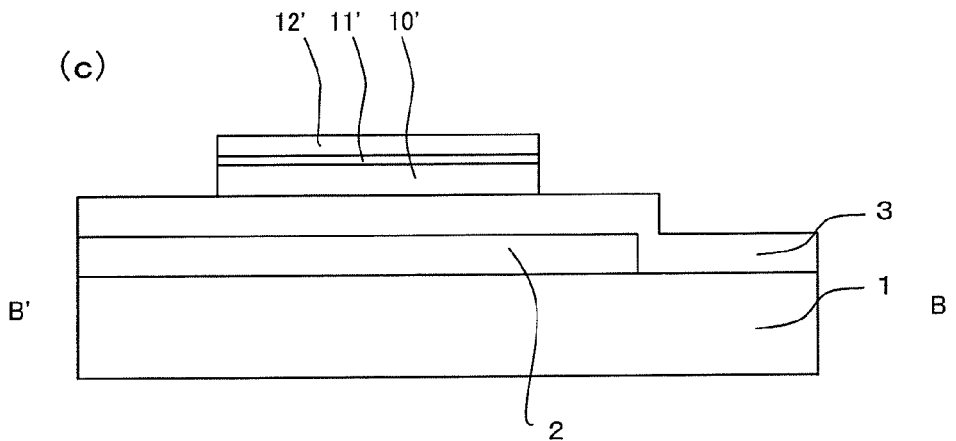

Thereafter, referring to FIGS. 6(*a*) to 6(*c*), a resist pattern film 15 is formed on the conductive film. The resist pattern film 15 is used as a mask to pattern the conductive film, thereby forming the source electrode 7 and the drain electrode 8.

The patterning of the conductive film can be performed using, for example, a wet etching method. In the present embodiment, the etchant used is a solution that is composed of 10 to 80 weight % of phosphoric acid, 1 to 10 weight % of nitric acid, 1 to 10 weight % of acetic acid, and water that constitutes the remaining part of the solution. Part of the resist pattern film 15 extending over the source electrode 7 and the drain electrode 8 is not removed after the end of the etching and is remaining in the resultant structure subjected to the next step.

The material of the source electrode 7 and the drain electrode 8 may be a material which contains, in addition to molybdenum (Mo), indium tin oxide (ITO), a simple metal of tungsten (W), copper (Cu), chromium (Cr), tantrum (Ta), aluminum (Al), titanium (Ti), or the like, a nitride or oxide of the simple metal, or an alloy of the simple metal which contains another metal. The source electrode 7 and the drain electrode 8 may be a single layer made of the above material or may have a layered structure. For example, the source electrode 7 and the drain electrode 8 may be a layered film containing titanium and aluminum, e.g., a Ti/Al/Ti layered film. Alternatively, it may be a layered film containing titanium and copper, e.g., a Ti/Cu/Ti layered film, or a layered film containing copper and molybdenum, e.g., a Mo/Cu/Mo layered film.

The formation method of the conductive film for formation of the source and drain electrodes may be a method different from sputtering, e.g., a deposition method. The formation method of the conductive film is not limited to the wet etching with the use of the above-described etchant. The thickness of the conductive film is not limited to the above-identified thickness.

(4) Source/Drain Separation Step S74:

Subsequently, part of the oxygen-containing silicon processed film 11' and the n$^+$ type silicon processed film 12' which is not covered with the source electrode 7 or the drain electrode 8 is removed. In this process, in part of the microcrystalline silicon film 10 which is not covered with the source electrode 7 or the drain electrode 8, part of the surface is removed due to overetching to become thinner than the other part. As a result, the oxygen-containing silicon layer 5 and the contact layers 6a, 6b are obtained from the oxygen-containing silicon processed film 11' and the n$^+$ type silicon processed film 12', respectively. The microcrystalline silicon film 10 changes into the microcrystalline silicon layer 4. After the etching, the resist pattern film 15 is removed. Thus, the semiconductor device 101 shown in FIGS. 1(a) to 1(c) is obtained.

In the present embodiment, the etching of the oxygen-containing silicon processed film 11' and the n$^+$ type silicon processed film 12' may be dry etching with the use of a chlorine (Cl$_2$) gas. After the end of the etching, the resist pattern film 15 is removed using a peeling solution which contains an organic alkali. The etching method is not limited to the above-described method.

In the above-described series of processes, there is a probability that a side wall 16 (FIG. 1(b)), which is formed by respective ends of the microcrystalline silicon layer 4, the oxygen-containing silicon layer 5, and the contact layers 6a, 6b of the semiconductor device 101, will be exposed to the atmospheric air, or the like, and as a result, an oxidized layer may be formed over the side wall 16. However, the degree of the oxidation is not so large that it would not deteriorate the effects of the invention. The semiconductor device of the present embodiment includes a semiconductor device which has such an oxidized layer.

Figure 22:
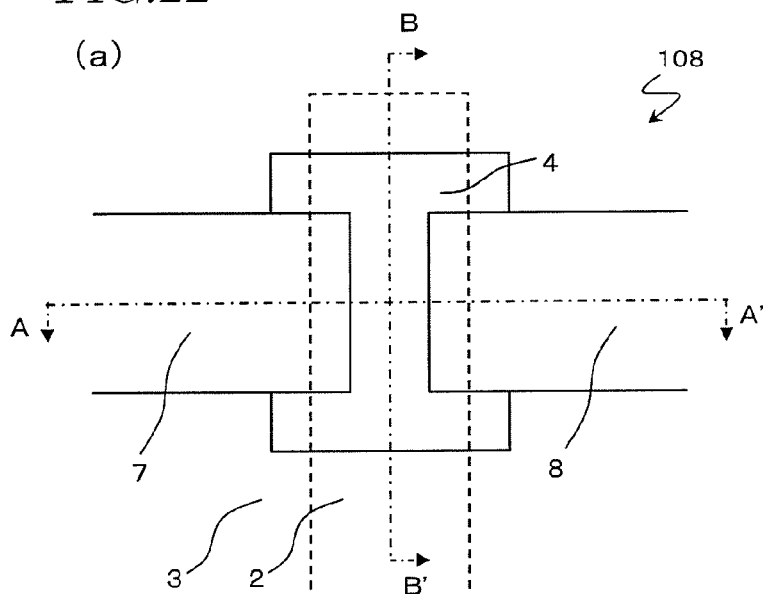
FIG. 22 (a) to (c) are diagrams schematically showing another structure example of the semiconductor device of embodiment 1 of the present invention. (a) is a plan view. (b) and (c) are cross-sectional views respectively taken along line A-A' and line B-B' of (a).
Figure 22:
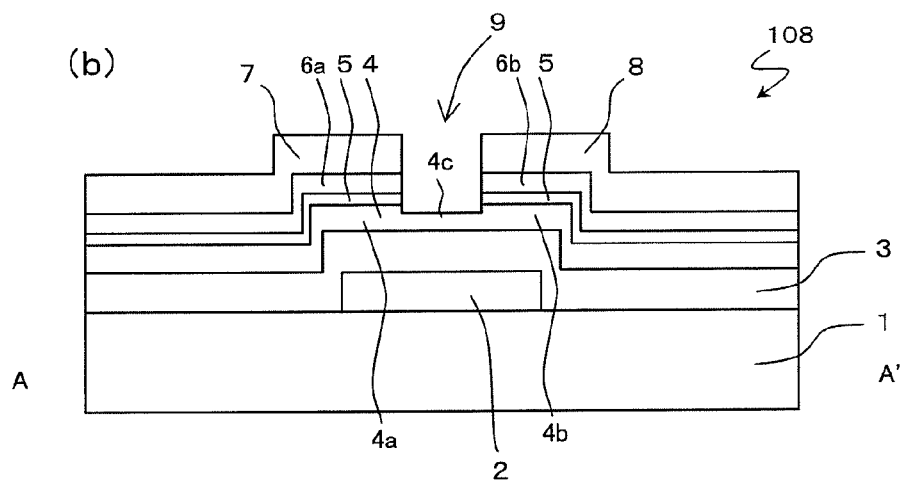
Figure 22:
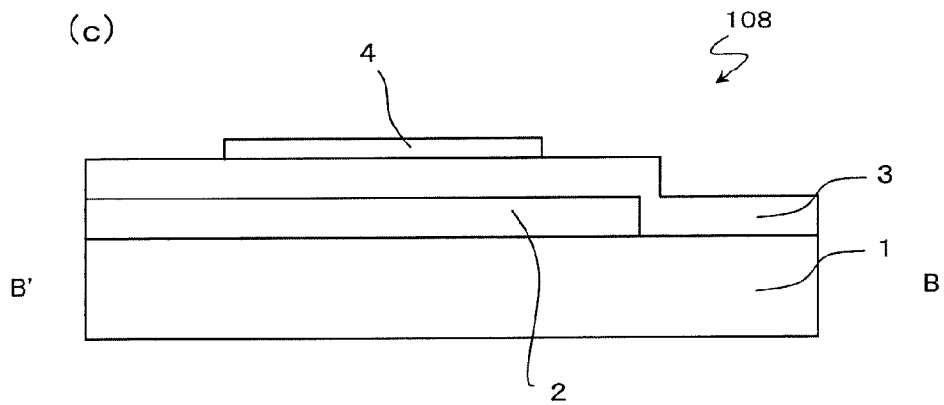

Note that the semiconductor layer (microcrystalline silicon layer 4) is not limited to the shape of an island although it has the shape of an island in the example shown in FIG. 1. FIG. 22 is a diagram showing another example of the semiconductor device of the present embodiment. FIG. 22(a) is a plan view of the semiconductor device. FIG. 22(b) is a cross-sectional view taken along line A-A' of FIG. 22(a). FIG. 22(c) is a cross-sectional view taken along line B-B' of FIG. 22(a). For the sake of simplicity, components that are the same as those of FIG. 1 are indicated by the same reference numerals, and the descriptions thereof are herein omitted.

In a semiconductor device 108, the patterns of the source and drain electrodes 7, 8, source wires (not shown), the contact layers 6a, 6b and the patterns of the semiconductor layer (microcrystalline silicon layer) 4 are generally the same except for the gap 9.

The semiconductor device 108 can be fabricated using the same fabrication method that is used for the above-described semiconductor device 101. Note that using half-tone exposure is advantageous in that the number of times of formation of the resist pattern film can be decreased, and that the source materials used for formation of the resist pattern films, such as photoresist materials, can be reduced.

A process that uses half-tone exposure is described in, for example, C. W. Kim et al., SID 2000 DIGEST, pp. 1006-1009. Specifically, first, on the substrate on which the gate electrode 2 and the gate insulating film 3 have been formed, a microcrystalline silicon film for formation of a microcrystalline silicon layer, an oxygen-containing silicon film for formation of an oxygen-containing silicon layer, an n$^+$ silicon film for formation of a contact layer, and a conductive film for formation of source and drain electrodes are formed in this order. Thereafter, a resist pattern is formed using half-tone exposure. The resist pattern has a thicker portion which corresponds to a part of the conductive film that is supposed to constitute the source and drain electrodes and a thinner portion which corresponds to another part of the conductive film that is supposed to constitute the gap. Then, the resist pattern is used as a mask to pattern the conductive film, the n$^+$ silicon film, the oxygen-containing silicon film, and the microcrystalline silicon film (first process). Then, the thickness of the entire resist pattern is reduced by dry etching, for example, such that the thinner portion of the resist pattern is removed to form an opening. Thereafter, the resist pattern in which the opening has been formed is used as a mask to pattern the conductive film, the n$^+$ silicon film, and the oxygen-containing silicon film (second process). In this way, the same resist pattern is used to pattern the conductive film, the n$^+$ silicon film, the oxygen-containing silicon film, and the microcrystalline silicon film. From these films, the source and drain electrodes 7, 8, the contact layers 6a, 6b, the oxygen-containing silicon layer 5, and the microcrystalline silicon layer 4 can be formed.

INVENTIVE EXAMPLE AND COMPARATIVE EXAMPLES

The present inventor fabricated semiconductor devices of an inventive example and comparative examples and evaluated the characteristics of the semiconductor devices. The methods and results thereof are described below.

A semiconductor device of the inventive example, which has the same structure as that of the semiconductor device 101 shown in FIGS. 1(a) to 1(c), was fabricated by the method previously described with reference to FIG. 2 to FIG. 6. In the inventive example, channel length L was 3 μm. The width of the source electrode and the drain electrode (hereinafter, simply "electrode width"), W, was 20 μm. Note that, herein, the offset portion is not considered, and the distance between the source and the drain in a plane parallel to the substrate surface (substrate plane), i.e., the distance between the first contact layer and the second contact layer in the substrate plane, is referred to as "channel length L". In the substrate plane, the width of the source electrode and the drain electrode along a direction perpendicular to channel length L is referred to as "width W of the source electrode and the drain electrode".

For comparison purposes, a semiconductor device was fabricated which had the same structure as that of the semiconductor device of the inventive example except for not including an oxygen-containing silicon layer (comparative example 1). Channel length L and electrode width W were also the same as those of the inventive example.

Figure 7:
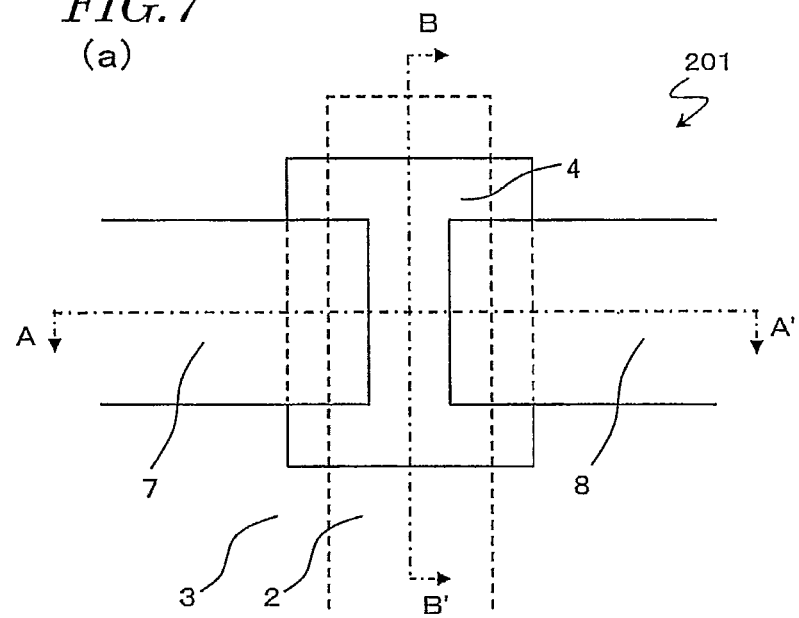
FIG. 7 (a) to (c) are diagrams schematically showing a semiconductor device of comparative example 1. (a) is a plan view. (b) and (c) are cross-sectional views respectively taken along line A-A' and line B-B' of (a).
Figure 7:
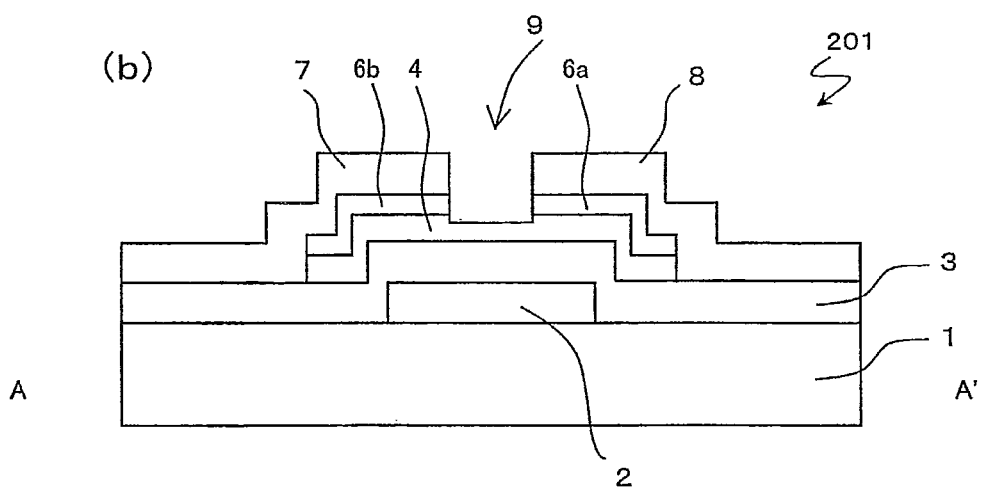
Figure 7:
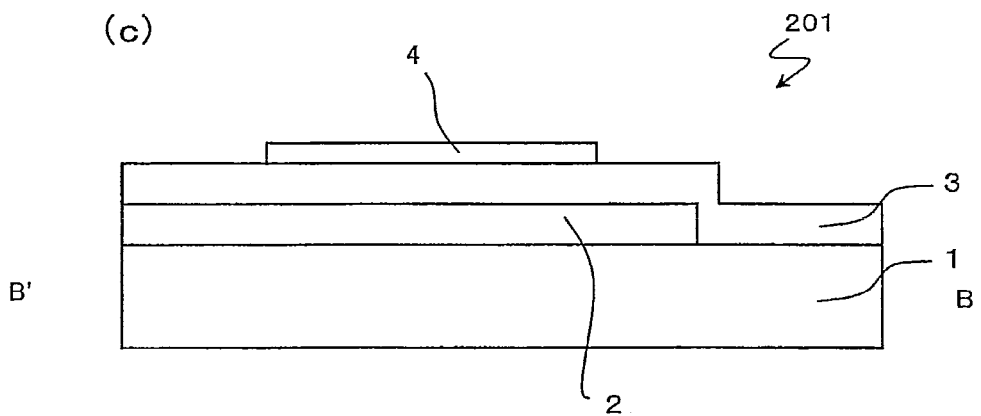

FIG. 7(a) is a schematic plan view of a semiconductor device 201 of comparative example 1. FIG. 7(b) is a cross-sectional view taken along line A-A' of FIG. 7(a). FIG. 7(c) is a cross-sectional view taken along line B-B' of FIG. 7(a). For the sake of simplicity, components of the semiconductor device 201 which are the same as those of the semiconductor device 101 shown in FIG. 1 are indicated by the same reference numerals, and the descriptions thereof are herein omitted.

In comparative example 1, a microcrystalline silicon film for formation of the microcrystalline silicon layer 4 and an n$^+$ type silicon film for formation of the contact layers 6a, 6b were formed by PECVD in succession in vacuum. Therefore, in the semiconductor device 201, a layer which contains oxygen was not formed between the microcrystalline silicon layer 4 and the contact layers 6a, 6b. The other details of the fabrication method and conditions were the same as those of the semiconductor device of the inventive example.

Further, the present inventor fabricated a semiconductor device which had the same structure as that of the semiconductor device 201 of comparative example 1 (FIG. 7) except that an amorphous silicon layer is used as the active layer (comparative example 2). Channel length L and electrode width W were the same as those of the inventive example and comparative example 1.

In comparative example 2, an amorphous silicon film for formation of an amorphous silicon layer that is supposed to constitute an active layer was formed by PECVD under the conditions that the substrate temperature was 250 to 300° C., the pressure was 50 to 300 Pa, and the power density was 5 to 15 mW/cm$^2$. The gases used for the film formation were silane (SiH$_4$) and hydrogen (H$_2$). The flow rate ratio of silane and hydrogen was 1:5 to 1:15. The other details of the fabrication method and conditions were the same as those of the semiconductor device of comparative example 1.

The TFT characteristics of the semiconductor devices of the inventive example and comparative examples 1 and 2 were obtained. In each of the semiconductor devices, current Id flowing from the source electrode to the drain electrode (drain current) was measured under the conditions that the potential of the drain electrode was 0 V (constant), the potential of the source electrode was 10 V (constant), and the potential of the gate electrode relative to the drain electrode (gate voltage), Vg, is varying.

Figure 8:
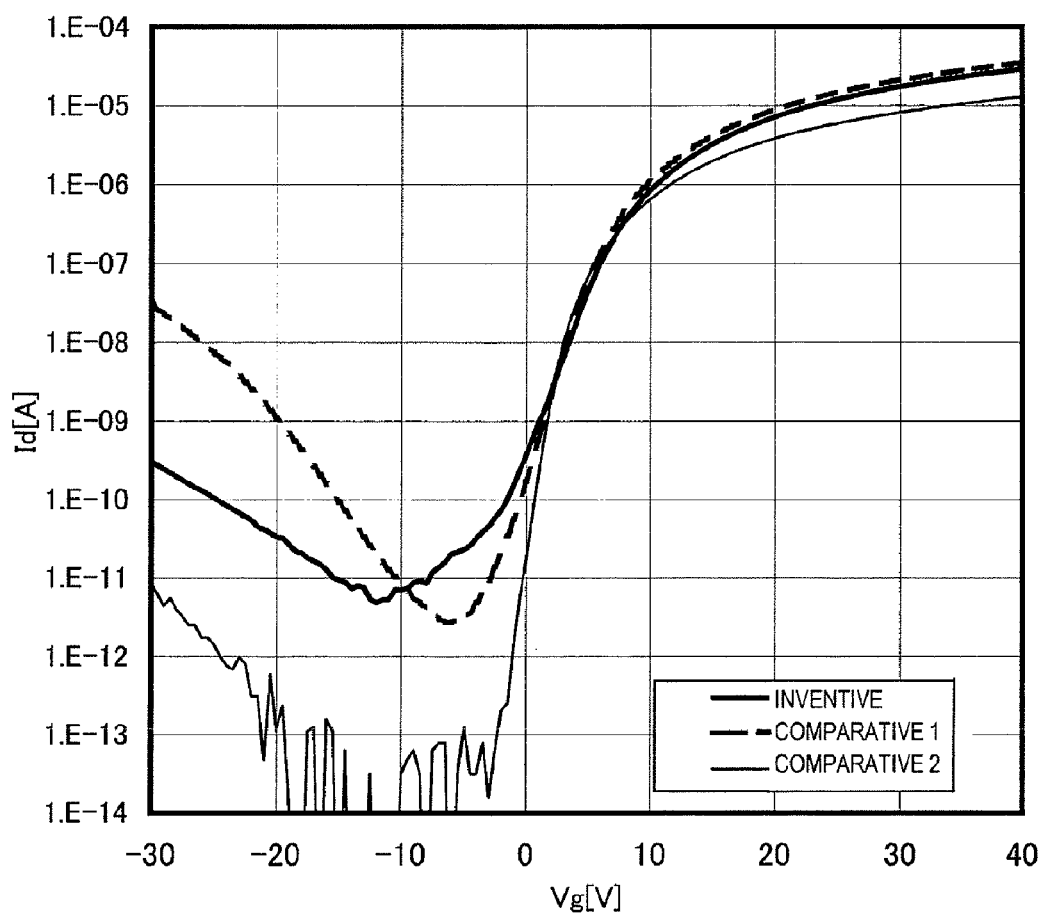
FIG. 8 A graph that shows the current-voltage characteristics of the semiconductor devices of the inventive example and comparative examples 1 and 2.

FIG. 8 is the graph which illustrates the current-voltage characteristic of the semiconductor devices of the inventive example and comparative examples 1 and 2. The ordinate axis represents drain current Id (A). The abscissas axis represents gate voltage Vg (V). TABLE 1 shows the measurement results of drain current Id for gate voltages Vg of −20 V, −10 V, 10 V, and 20 V in the semiconductor devices of the inventive example and comparative examples 1 and 2. Based on the measurement results, the ON/OFF ratio of the respective semiconductor devices was calculated. The results of the calculation were shown in TABLE 2.

As seen from the above results, the ON current and mobility of the semiconductor device of the inventive example were slightly lower than those of the semiconductor device of comparative example 1, while the OFF current of the semiconductor device of the inventive example was significantly lower than that of the semiconductor device of comparative example 1. As a result, it was confirmed that the ON/OFF ratio achieved in the semiconductor device of the inventive example was higher than the semiconductor device of comparative example 1. In particular, when gate voltage Vg was −20 V, the OFF current of the semiconductor device of the inventive example was extremely lower than that of the semiconductor device of comparative example 1. It was confirmed that the ON/OFF ratio (ON current (Vg=20 V)/OFF current (Vg=−20 V)) was improved by two or more orders of magnitude.

Thus, by providing an oxygen-containing silicon layer between the contact layer and the active layer, the OFF characteristic can be improved, and a semiconductor device particularly useful for liquid crystal display devices can be obtained. This may be because the oxygen-containing silicon layer functions as an electric resistor which is connected in series to the semiconductor device.

It was also confirmed that the semiconductor devices of the inventive example and comparative example 1 which included the active layer formed of microcrystalline silicon had an ON characteristic sufficiently higher than the semiconductor device of comparative example 2 which included the active layer formed of amorphous silicon.

The semiconductor device of comparative example 2 used amorphous silicon of low mobility, and therefore, both the ON current and the OFF current were extremely low. As a result, a high ON/OFF characteristic was achieved. However, when the semiconductor device of comparative example 2 is applied to a liquid crystal display device, or the like, it may be difficult to realize higher image quality and lower power consumption because the mobility and the ON current are low as previously described.

It is seen from the measurement results shown above that the semiconductor device of the inventive example can suitably be used in a liquid crystal display device. The reasons for this are described below.

TABLE 1

| | Active Layer | Oxygen-containing Si Layer | Mobility (cm$^2$/Vs) | OFF Current (Vg = −20 V) | OFF Current (Vg = −10 V) | ON Current (Vg = 10 V) | ON Current (Vg = 20 V) |
| --- | --- | --- | --- | --- | --- | --- | --- |
| Inventive Example | μc-Si | Included | 0.66 cm$^2$/Vs | 3.3 × 10 pA | 7.1 pA | 0.84 μA | 7.2 μA |
| Comp. Example 1 | μc-Si | Not Included | 0.79 cm$^2$/Vs | 1.1 × 10$^3$ pA | 8.3 pA | 1.1 μA | 8.8 μA |
| Comp. Example 2 | a-Si | Not Included | 0.30 cm$^2$/Vs | 1.1 × 10$^{-1}$ pA | 3.1 × 10$^{-2}$ pA | 0.65 μA | 3.8 μA |

TABLE 2

| | ON/OFF Ratio ON Current (Vg = 20 V)/ OFF Current (Vg = −20 V) | ON/OFF Ratio ON Current (Vg = 20 V)/ OFF Current (Vg = −10 V) |
| --- | --- | --- |
| Inventive Example | 2.2 × 10$^5$ | 1.0 × 10$^6$ |
| Comparative Example 1 | 8.1 × 10$^3$ | 1.1 × 10$^6$ |
| Comparative Example 2 | 3.5 × 10$^7$ | 1.2 × 10$^8$ |

In the liquid crystal display devices, a predetermined electric field is applied to the liquid crystal by means of a potential provided to a pixel electrode via a switching element, whereby the transmittance of the liquid crystal is controlled to perform display. In this mechanism, if the OFF current of a TFT which serves as the switching element (pixel TFT) is large, it would constitute a factor detrimental to the display characteristics. To maintain the pixel electrode potential, in the case of a semiconductor device which has such a size that the characteristic of FIG. 8 is achieved, the OFF current is preferably about 10 to 100 pA or less. If it far exceeds this range, there is a probability that the display quality will degrade. Specifically, if the OFF current is large, there is a probability that flicker will occur, or the display unevenness will occur in the display of an intermediate grayscale level. On the other hand, for gate voltage Vg which is to be applied to a pixel TFT of the liquid crystal display device, a commonly-employed lower limit value is about −20 V.

The semiconductor device of the inventive example has a sufficiently-low OFF current, an excellent ON/OFF ratio, and an excellent mobility than that of the amorphous silicon TFT, even when gate voltage Vg is −20 V. Thus, it is suitably applicable to a pixel TFT for use in, for example, a liquid crystal display device which has an excellent display quality, such as double-speed driving at 120 hertz, a liquid crystal display device of low power consumption, and a liquid crystal display device of a larger size. Further, it is applicable to peripheral circuits of these liquid crystal display devices.

Embodiment 2

Hereinafter, the second embodiment of the semiconductor device of the present invention is described with reference to the drawings.

Figure 9:
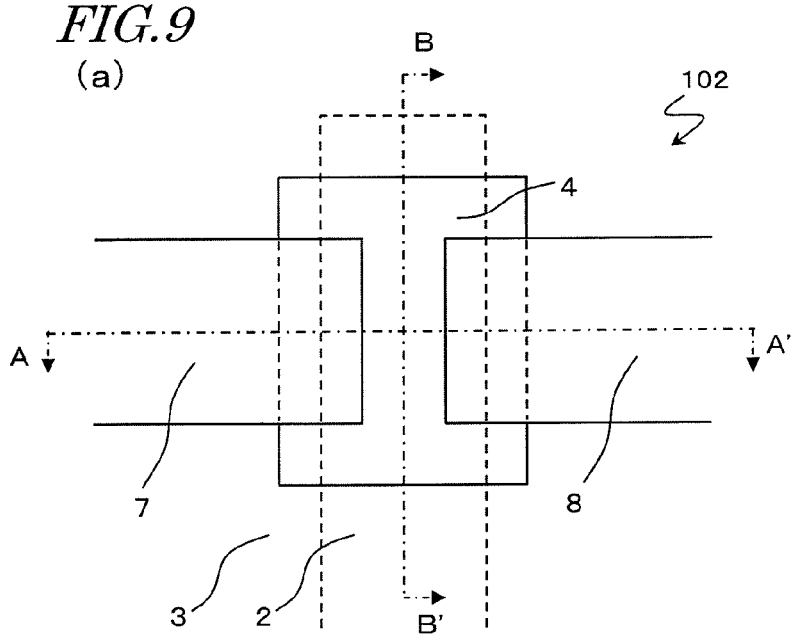
FIG. 9 (a) to (c) are diagrams schematically showing a semiconductor device of embodiment 2 of the present invention. (a) is a plan view. (b) and (c) are cross-sectional views respectively taken along line A-A' and line B-B' of (a).
Figure 9:
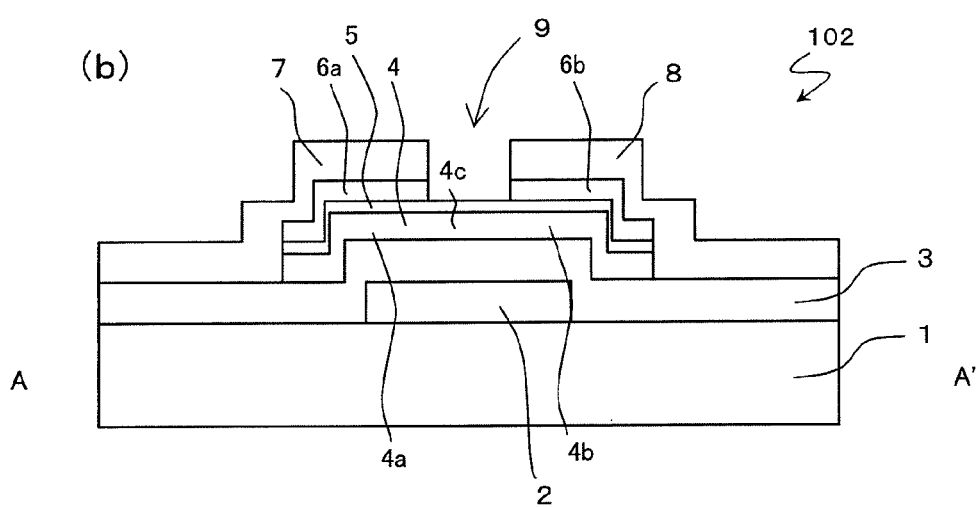
Figure 9:
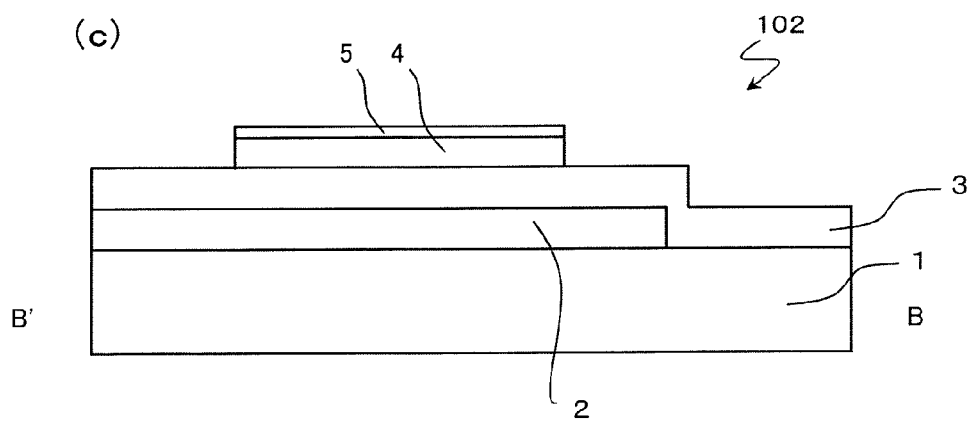

FIG. 9 is a diagram schematically showing a semiconductor device of the present embodiment. FIG. 9(a) is a plan view of the semiconductor device. FIG. 9(b) is a cross-sectional view taken along line A-A' of FIG. 9(a). FIG. 9(c) is a cross-sectional view taken along line B-B' of FIG. 9(a). For the sake of simplicity, components which are the same as those of the semiconductor device 101 shown in FIGS. 1(a) to 1(c) are indicated by the same reference numerals, and the descriptions thereof are herein omitted.

The semiconductor device 102 is an inverted staggered channel etching type TFT which has a bottom gate structure as in embodiment 1. The semiconductor device 102 is different from the semiconductor device 101 in that the oxygen-containing silicon layer 5 covers the entire upper surface of the microcrystalline silicon layer 4. In other words, the oxygen-containing silicon layer 5 has the same planar shape as that of the microcrystalline silicon layer 4 so that it also extends over the channel region 4c. The microcrystalline silicon layer 5 does not include a portion thinned by overetching as the microcrystalline silicon layer 4 of the semiconductor device 101 does, and therefore has a generally uniform thickness.

The semiconductor device 102 is fabricated through the procedure previously described with reference to FIG. 2. The processes from gate electrode formation step S71 to source/drain electrode formation step S73 are the same as those of embodiment 1 previously described with reference to FIG. 3 to FIG. 6. Note that source/drain separation step S74 is different from embodiment 1 in the points described below.

Again refer to FIG. 6. In the source/drain separation step of the present embodiment, part of the n⁺ type silicon processed film 12' which is not covered with the source electrode 7 or the drain electrode 8 is etched away using the resist pattern film 15. The etching method used herein may be dry etching mainly using a chlorine (Cl₂) gas as in embodiment 1. In the present embodiment, in the etching of the n⁺ type silicon processed film 12', the oxygen-containing silicon processed film 11' is used as an etch stopper layer. Accordingly, the oxygen-containing silicon processed film 11' is not etched away, so that it is remaining in a final form of the semiconductor device and constitutes the oxygen-containing silicon layer 5. After the etching, the resist pattern film 15 is removed using a peeling solution which contains an organic alkali. In this way, the semiconductor device 102 as shown in FIGS. 9(a) to 9(c) is obtained.

In the above method, the microcrystalline silicon layer 4 is not damaged by etching in the source/drain separation step. Therefore, variations in the thickness and characteristics of the microcrystalline silicon layer provided in the gap 9 (remaining film) across the substrate plane can be prevented. Thus, variations in the semiconductor characteristics, such as mobility, threshold, etc., across the substrate plane are unlikely to occur, so that the high productivity is also achieved when semiconductor devices are fabricated over a large substrate.

In the present embodiment, the OFF current is decreased due to the oxygen-containing silicon layer 5 as in the semiconductor device of embodiment 1. The ON/OFF ratio achieved in the present embodiment is higher than a semiconductor device which does not include an oxygen-containing silicon layer. Also, in the fabrication process of the semiconductor device 102, by utilizing the oxygen-containing silicon layer 5 as an etch stop layer, the productivity is improved particularly when the semiconductor devices are fabricated over a large substrate.

Embodiment 3

Hereinafter, embodiment 3 of the semiconductor device of the present invention is described with reference to the drawings.

Figure 10:
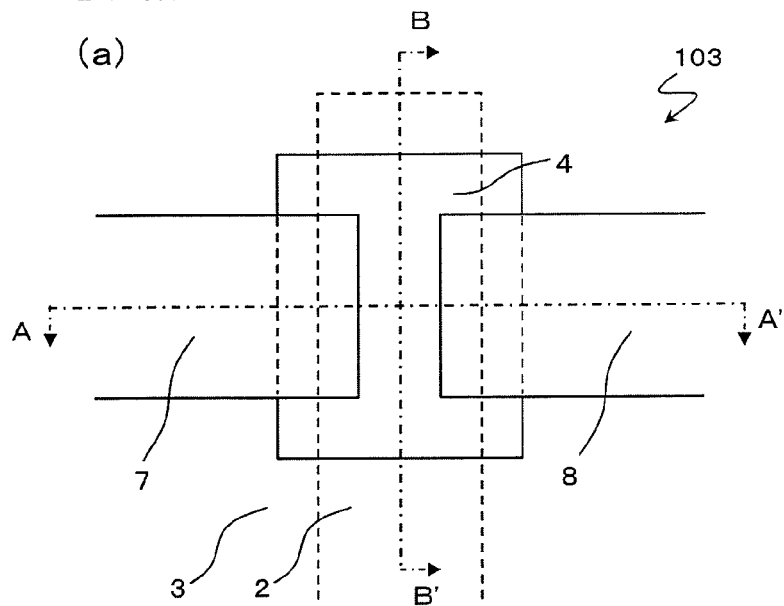
FIG. 10 (a) to (c) are diagrams schematically showing a semiconductor device of embodiment 3 of the present invention. (a) is a plan view. (b) and (c) are cross-sectional views respectively taken along line A-A' and line B-B' of (a).
Figure 10:
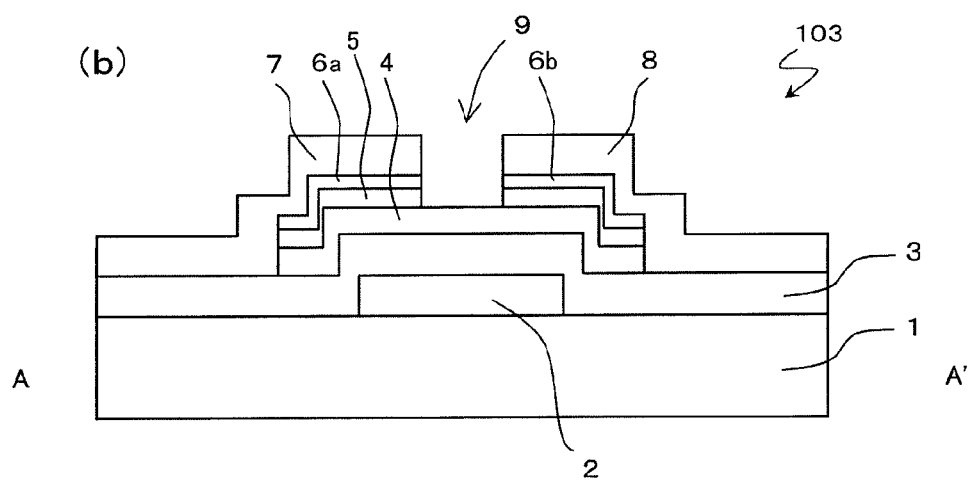
Figure 10:
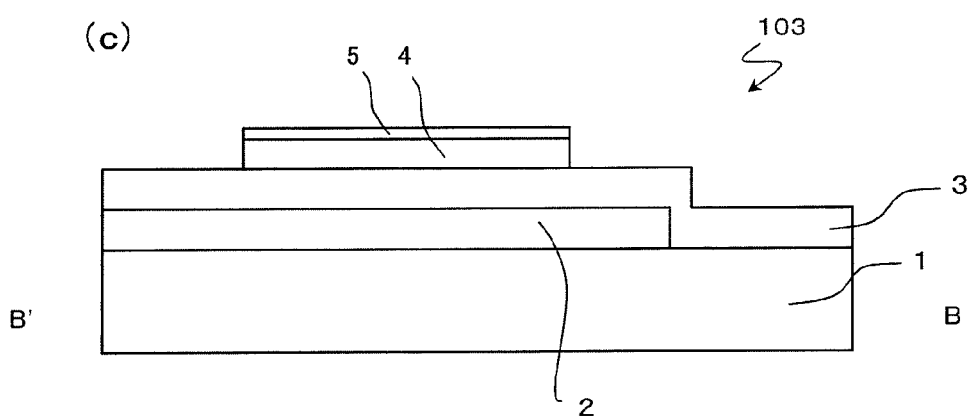

FIG. 10 is a diagram schematically showing the structure of a semiconductor device of the present embodiment. FIG. 10(a) is a plan view of the semiconductor device. FIG. 10(b) is a cross-sectional view taken along line A-A' of FIG. 10(a). FIG. 10(c) is a cross-sectional view taken along line B-B' of FIG. 10(a). For the sake of simplicity, components which are the same as those of the semiconductor device 101 shown in FIGS. 1(a) to 1(c) are indicated by the same reference numerals, and the descriptions thereof are herein omitted.

The semiconductor device 103 is an inverted staggered channel etching type TFT which has a bottom gate structure as in embodiment 1. In the semiconductor device 103, as in the semiconductor device 101 of embodiment 1, the oxygen-containing silicon layer 5 is not provided on part of the microcrystalline silicon layer 4 which corresponds to the gap 9 and has the same planar shape as that of the contact layers 6a, 6b. The microcrystalline silicon layer 4 of the present embodiment is different from the microcrystalline silicon layer 4 of the semiconductor device 101 of embodiment 1 in that it does not include a portion thinned by overetching and has a generally uniform thickness.

The semiconductor device 103 is fabricated by the same method as that of the semiconductor device 102 of embodiment 2 which has been previously described. Note that, in the present embodiment, the source/drain separation step includes, prior to removal of the resist pattern film used as the etching mask, an additional etching step for removing part of the oxygen-containing silicon film used as the etch stop layer. Details of this step are described below.

Again refer to FIG. 6. In the source/drain separation step of the present embodiment, part of the n⁺ type silicon processed film 12' which is not covered with the source electrode 7 or the drain electrode 8 is etched away using the resist pattern film 15. The etching method used herein may be dry etching mainly using a chlorine (Cl₂) gas, with the use of the oxygen-containing silicon processed film 11' as the etch stopper layer as in embodiment 2. Subsequently, an additional etching is performed. The additional etching is performed by immersing the substrate 1 in a 0.1 to 5 weight % hydrogen fluoride aqueous solution for 30 to 1800 seconds. In this process, by appropriately selecting the concentration of the hydrogen fluoride aqueous solution and the duration of the immersion, part of the oxygen-containing silicon processed film 11' which is exposed through the resist pattern film 15 can be removed while the microcrystalline silicon layer 4 is hardly damaged. As a result, the oxygen-containing silicon layer 5 is formed from the oxygen-containing silicon processed film 11'. Then, the resist pattern film 15 is removed using a peeling solution which contains an organic alkali. In this way, the semiconductor device 103 as shown in FIGS. 10(*a*) to 10(*c*) is obtained.

In the above method, the microcrystalline silicon layer 4 is not damaged by etching in the source/drain separation step. Therefore, variations in the thickness and characteristics of the microcrystalline silicon layer provided in the gap 9 (remaining film) across the substrate plane can be prevented. Thus, variations in the semiconductor characteristics, such as mobility, threshold, etc., across the substrate plane are unlikely to occur, so that the high productivity is also achieved when semiconductor devices are fabricated over a large substrate.

Thus, the semiconductor device 103 of the present embodiment exhibits such semiconductor characteristics that the variation in the characteristics across the substrate plane is small and that the ON/OFF ratio is excellent as the semiconductor device 102 of embodiment 2 does.

Embodiment 4

Hereinafter, embodiment 4 of the semiconductor device of the present invention is described with reference to the drawings.

Figure 11:
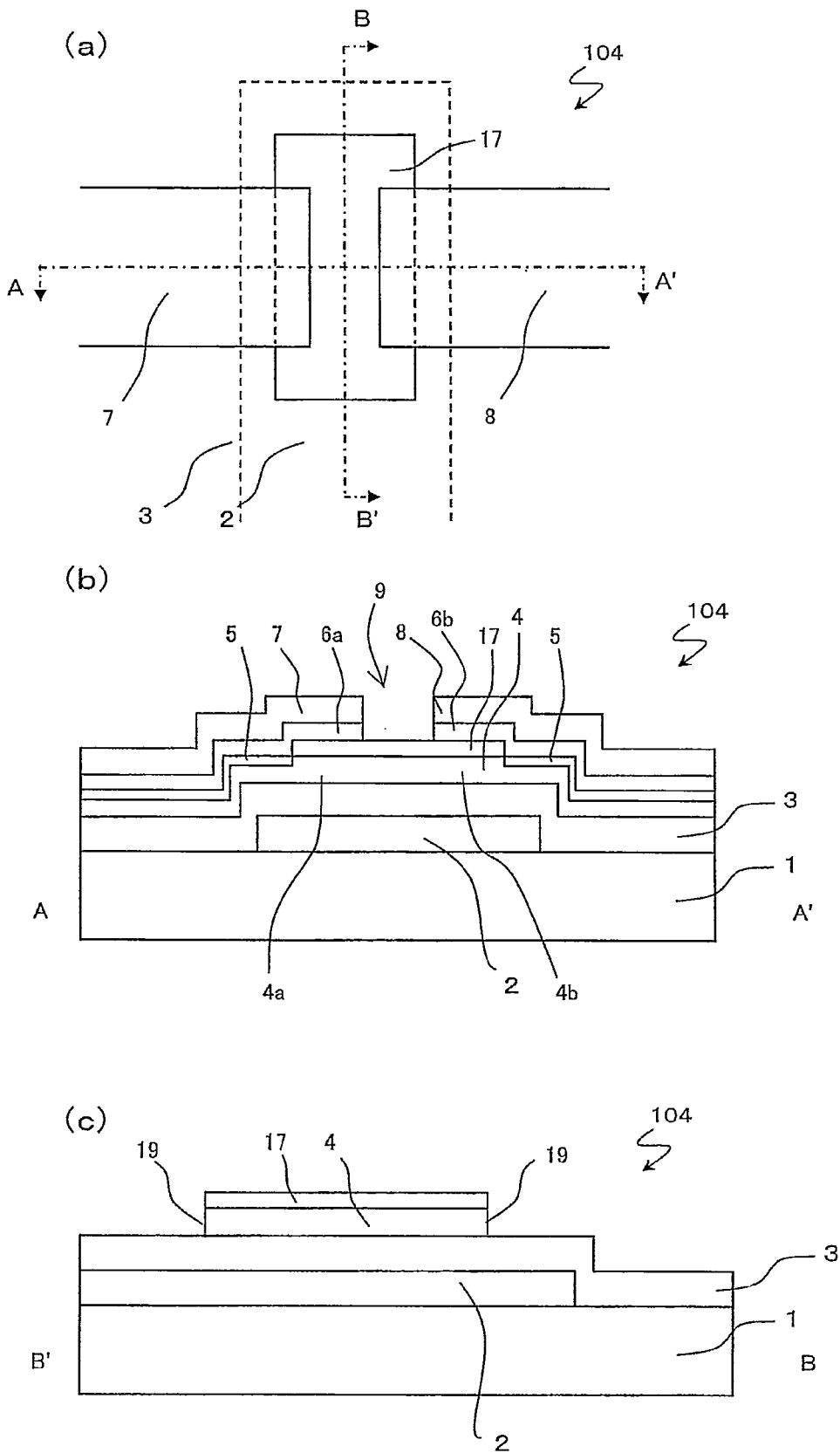
FIG. 11 (a) to (c) are diagrams schematically showing a semiconductor device of embodiment 4 of the present invention. (a) is a plan view. (b) and (c) are cross-sectional views respectively taken along line A-A' and line B-B' of (a).

FIG. 11 is a diagram schematically showing the structure of a semiconductor device of the present embodiment. FIG. 11(*a*) is a plan view of the semiconductor device. FIG. 11(*b*) is a cross-sectional view taken along line A-A' of FIG. 11(*a*). FIG. 11(*c*) is a cross-sectional view taken along line B-B' of FIG. 11(*a*). For the sake of simplicity, components which are the same as those of the semiconductor device 101 shown in FIGS. 1(*a*) to 1(*c*) are indicated by the same reference numerals, and the descriptions thereof are herein omitted.

The semiconductor device 104 is an inverted staggered etch stopper type TFT which has a bottom gate structure. In the semiconductor device 104, the contact layers 6*a*, 6*b* and the source electrode 7 and the drain electrode 8 have the same planar shape. The semiconductor device 104 is different from the semiconductor device 101 of embodiment 1 in that an etch stop layer 17 is provided on part of the microcrystalline silicon layer 4 which is not covered with the oxygen-containing silicon layer 5. In other words, as for the microcrystalline silicon layer 4 of the semiconductor device 104, the oxygen-containing silicon layer 5 is provided on the first and second regions 4*a*, 4*b*, and the etch stop layer 17 is provided on the channel region 4*c*. The etch stop layer 17 may be a silicon nitride layer, a silicon oxide nitride layer containing nitrogen and oxygen ($SiN_xO_y$), a silicon oxide layer ($SiO_x$), or the like. Here, the microcrystalline silicon layer 4 is not in an island-like pattern, but is provided under the source electrode 7, the drain electrode 8, and the etch stop layer 17 so as to have the same planar shape as that of these elements. The other components and the operation are the same as those of the semiconductor device 101.

In the present embodiment, the oxygen-containing silicon layer 5 is provided between the microcrystalline silicon layer 4 and the contact layers 6*a*, 6*b* as in the above-described embodiments, so that the OFF current can be reduced, and the ON/OFF ratio can be improved. Also, the microcrystalline silicon layer 4 is used as the active layer, and therefore, a higher mobility and a higher ON current than those of the conventional amorphous silicon TFT can be achieved. Part of the microcrystalline silicon layer 4 which corresponds to the gap 9 is covered with the etch stop layer 17, so that the microcrystalline silicon layer 4 can be prevented from being damaged by overetching during the fabrication process. Thus, variation in the semiconductor characteristics across the substrate plane can be prevented.

<Fabrication Method of Semiconductor Device 104>

Next, an example of the fabrication method of the semiconductor device 104 of the present embodiment is described with reference to the drawings.

Figure 12:
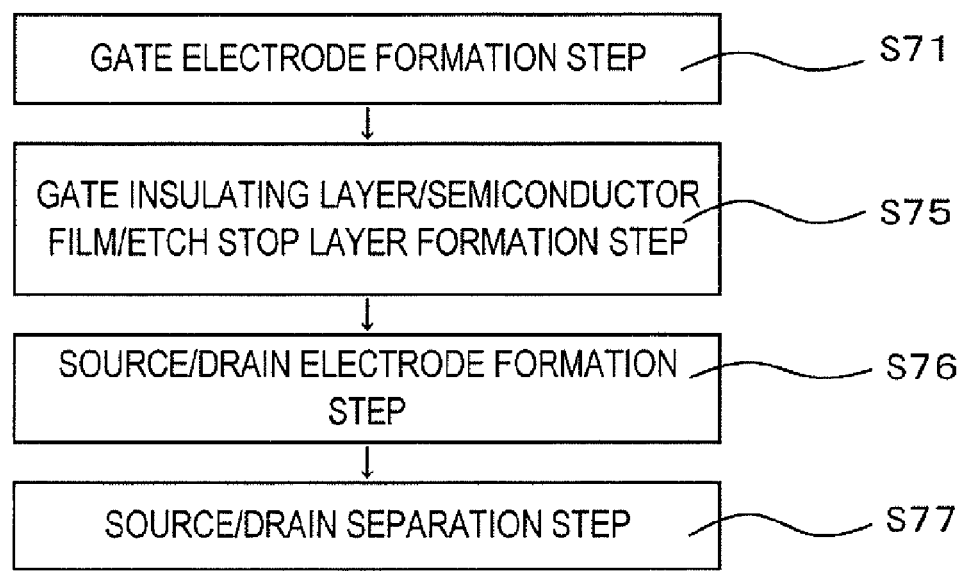
FIG. 12 A flowchart for illustrating an example of the fabrication method of the semiconductor device of embodiment 4 of the present invention.

FIG. 12 is a flowchart for illustrating a general procedure of the fabrication method of the present embodiment. As shown in FIG. 12, the fabrication method of the semiconductor device 104 includes gate electrode formation step S71 for forming a gate electrode, gate insulating layer/semiconductor film/etch stop layer formation step S75 for forming a gate insulating layer, a semiconductor film which serves as an active layer, and an etch stop layer, source/drain electrode formation step S76 for forming source and drain electrodes, and source/drain separation step S77 for electrically separating the source and drain electrodes.

Figure 13:
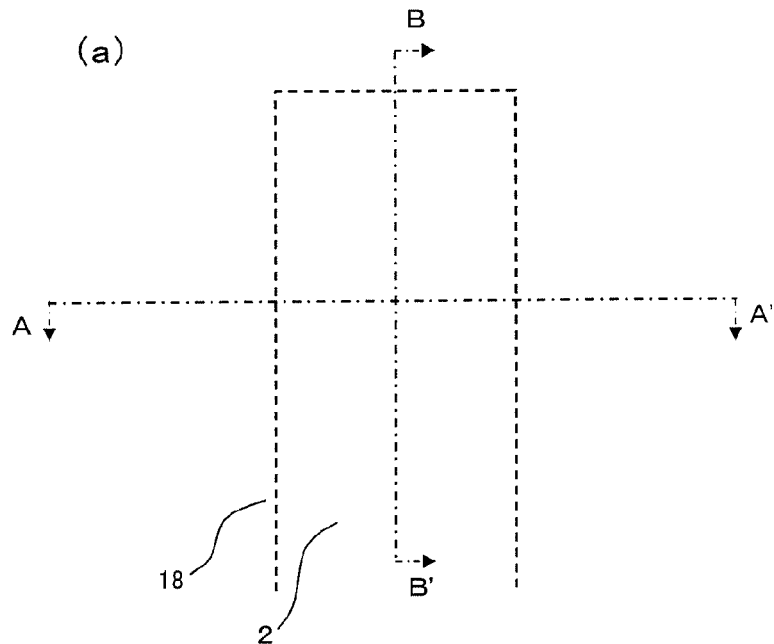
FIG. 13 (a) to (c) are diagrams for illustrating a fabrication step of the semiconductor device of embodiment 4 of the present invention. (a) is a plan view. (b) and (c) are cross-sectional views respectively taken along line A-A' and line B-B' of (a).
Figure 13:
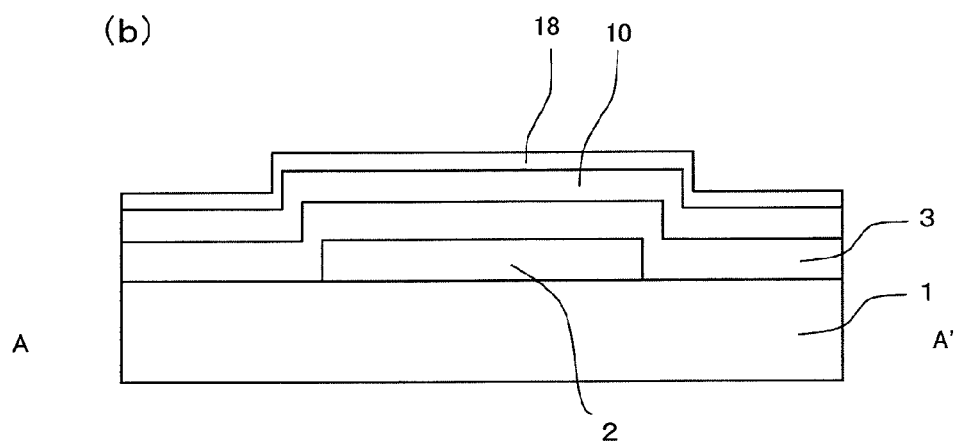
Figure 13:
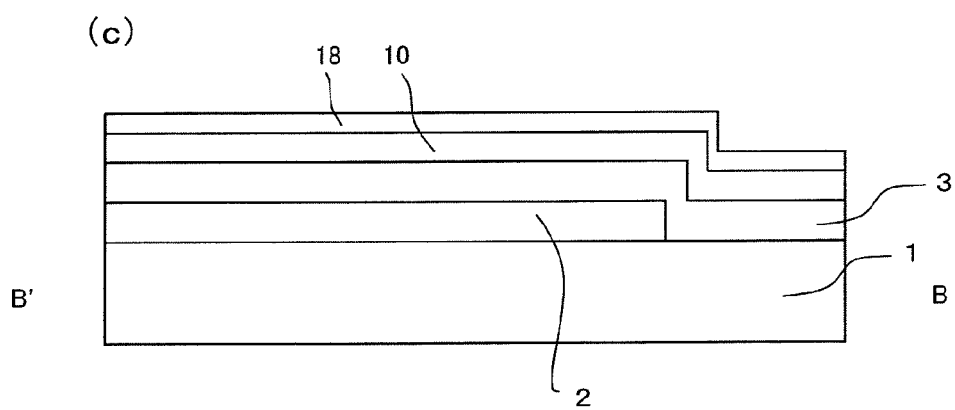
Figure 14:
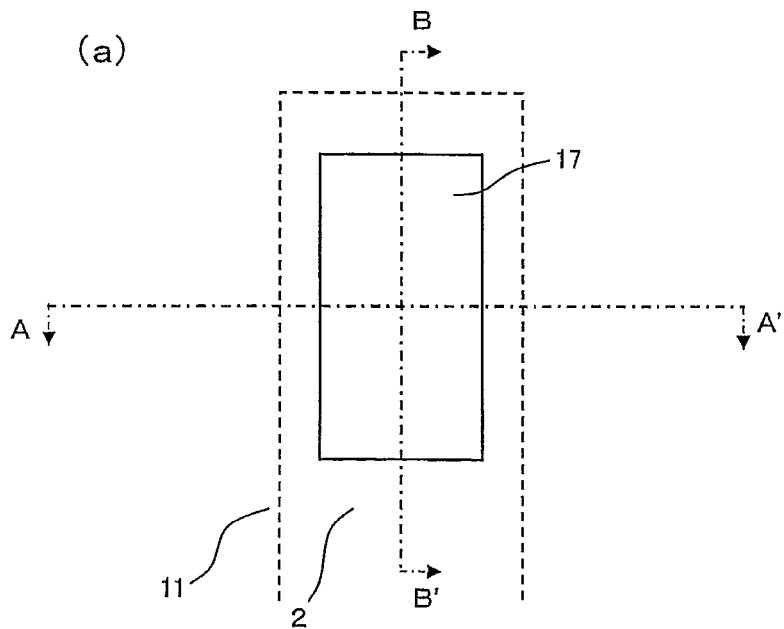
FIG. 14 (a) to (c) are diagrams for illustrating a fabrication step of the semiconductor device of embodiment 4 of the present invention. (a) is a plan view. (b) and (c) are cross-sectional views respectively taken along line A-A' and line B-B' of (a).
Figure 14:
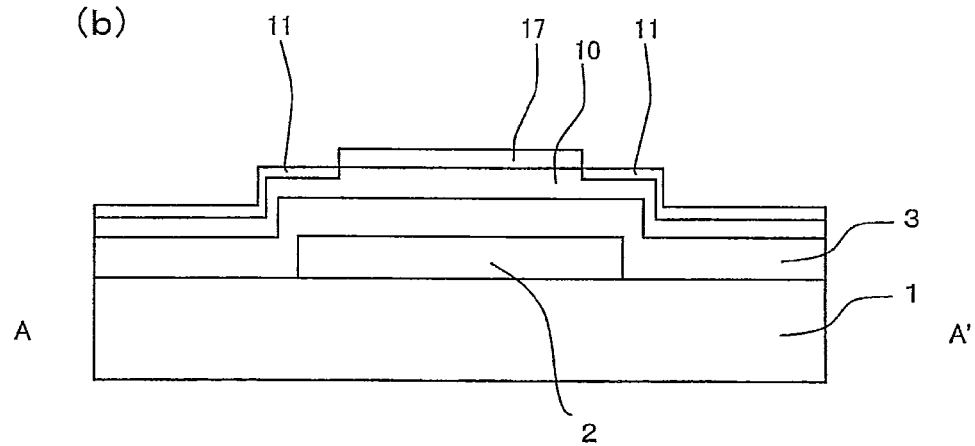
Figure 14:
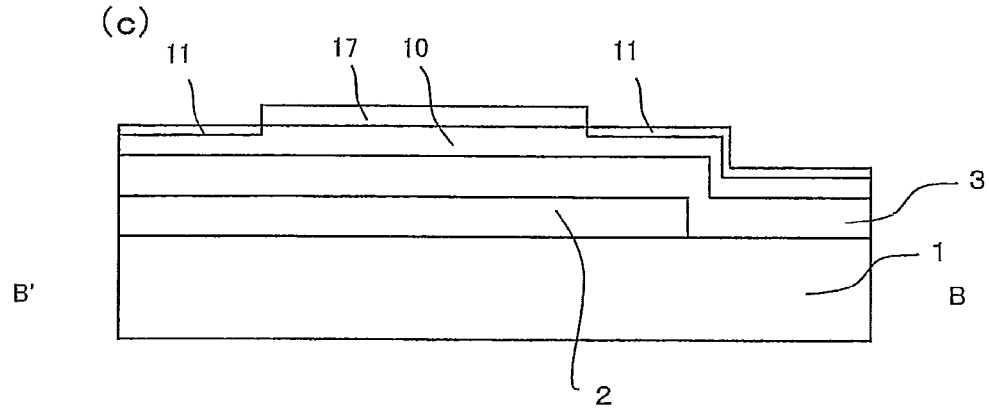
Figure 15:
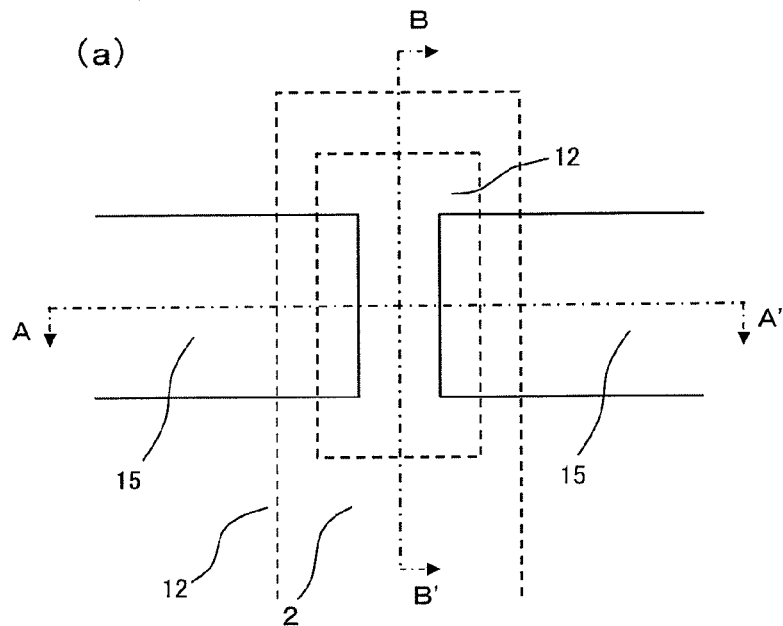
FIG. 15(a) to (c) are diagrams for illustrating a fabrication step of the semiconductor device of embodiment 4 of the present invention. (a) is a plan view. (b) and (c) are cross-sectional views respectively taken along line A-A' and line B-B' of (a).
Figure 15:
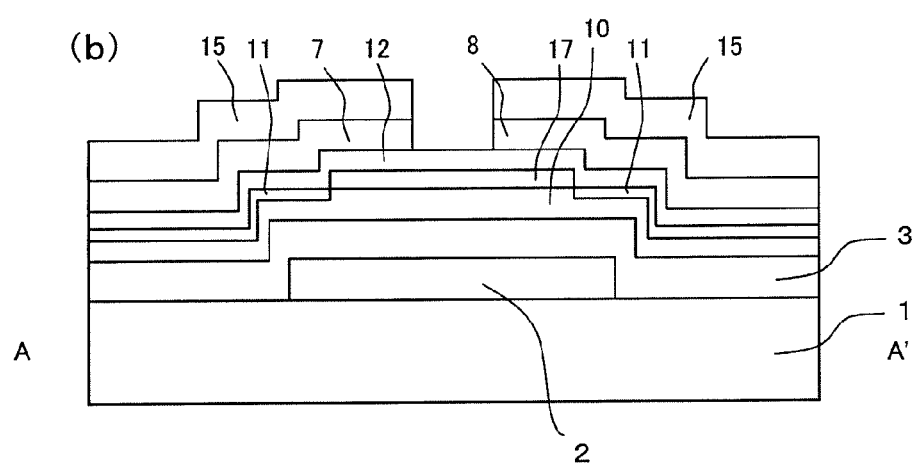
Figure 15:
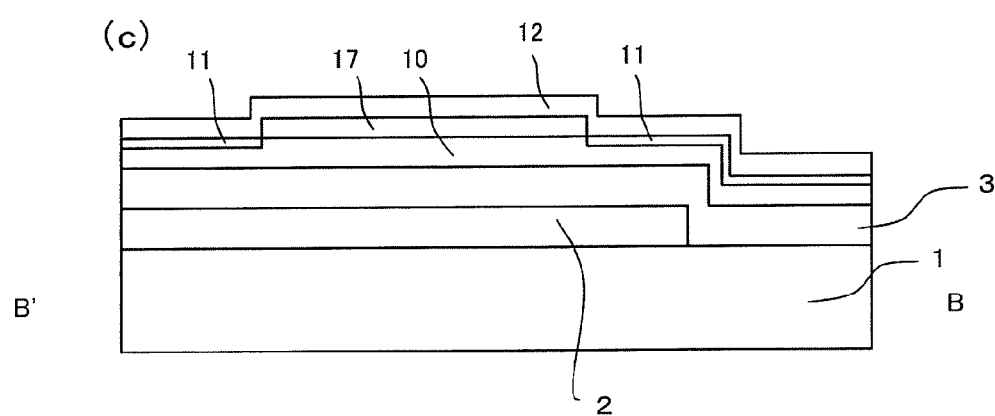

Hereinafter, the fabrication method is described in detail step by step with reference to FIG. 13 to FIG. 15. FIG. 13 to FIG. 15 are diagrams of the steps for illustrating the fabrication method of the semiconductor device 104. FIG. 13(*a*) is a plan view. FIG. 13(*b*) is a cross-sectional view taken along line A-A' of FIG. 13(*a*). FIG. 13(*c*) is a cross-sectional view taken along line B-B' of FIG. 13(*a*). The same applies to FIG. 14 and FIG. 15. In each of these drawings, (*a*) is a plan view, (*b*) is a cross-sectional view taken along line A-A' of the corresponding plan view, and (*c*) is a cross-sectional view taken along line B-B' of the corresponding plan view.

(1) Gate Electrode Formation Step S71:

This is the same as that of embodiment 1 previously described with reference to FIGS. 3(*a*) to 3(*c*), and therefore, the detailed description is herein omitted.

(2) Gate Insulating Layer/Semiconductor Film/Etch Stop Layer Formation Step S75:

Referring to FIGS. 13(*a*) to 13(*c*), a gate insulating layer 3, a microcrystalline silicon film 10, and a silicon nitride film 18 are formed in this order on the gate electrode 2.

Specifically, first, on the substrate 1 on which the gate electrode 2 has been formed, a gate insulating layer 3 (e.g., 0.4 μm thick) is formed of silicon nitride ($SiN_x$) by plasma enhanced chemical vapor deposition (PECVD). In the present embodiment, the formation of the gate insulating layer 3 is performed in a film formation chamber which has an electrode structure of a parallel plate type (capacitively-coupled type) under the conditions that the substrate temperature is 300° C., the pressure is 50 to 300 Pa, and the power density is 10 to 20 mW/cm$^2$. The gas used herein for the film formation is a mixture gas of silane ($SiH_4$), ammonium ($NH_3$), and nitrogen ($N_2$).

Then, a microcrystalline silicon film 10 (e.g., 0.05 μm thick) is formed using the same film formation chamber. In the present embodiment, the formation of the microcrystalline silicon film 10 is performed under the conditions that the substrate temperature is 250 to 300° C., the pressure is 50 to 300 Pa, and the power density is 5 to 30 mW/cm$^2$ with the use of a silane gas which is diluted with a hydrogen gas as the film formation gas. The flow rate ratio of silane ($SiH_4$) and hydrogen ($H_2$) is 1:200 to 1:1000.

Thereafter, furthermore, a silicon nitride film 18 (e.g., 0.15 μm thick) is formed using the same film formation chamber. The formation of the silicon nitride film 18 is performed under the same conditions, with the use of the same gas, as those used in the formation of the gate insulating layer 3.

Then, referring to FIGS. 14(a) to 14(c), the silicon nitride film 18 is patterned to form the etch stop layer 17, while an oxygen-containing silicon film 11 is formed on part of the microcrystalline silicon layer 4 which is not covered with the etch stop layer 17.

In the present embodiment, the patterning of the silicon nitride film 18 is performed by photolithography. Specifically, a resist pattern film (not shown) is formed on the silicon nitride film 18, and this is used as a mask for etching. The etching used herein may be dry etching, for example, with the use of a combination of a carbon tetrafluoride ($CF_4$) gas, oxygen ($O_2$), etc. Note that a wet etching method with the use of a hydrogen fluoride aqueous solution may be used instead.

After the etching process, the surface of part of the microcrystalline silicon film 10 which is not covered with the resist pattern film (exposed surface) is exposed to air that contains oxygen. As a result, the exposed surface of the microcrystalline silicon film 10 is oxidized to become an oxygen-containing silicon film 11. The preferable range of the thickness of the oxygen-containing silicon film 11 is the same as the range described in embodiment 1. In the present embodiment, the thickness of the oxygen-containing silicon film 11 is, for example, 1 to 10 nm.

The above-described resist pattern film is removed by a peeling solution which contains an organic alkali after the etching of the silicon nitride film 18.

Note that, if a surface oxide film has been formed on the microcrystalline silicon film 10 before the formation of the oxygen-containing silicon film 11, the oxygen-containing silicon film 11 may be formed by the above-described method after the surface oxide film is once removed by using a hydrogen fluoride aqueous solution.

The formation method of the oxygen-containing silicon film 11 may be any method so long as it enables formation of a silicon film that contains oxygen. The surface oxide film of the microcrystalline silicon film 10 may be formed by, for example, a surface oxidizing method with the use of ozone, an oxidizing method with the use of oxygen plasma, or an oxidizing method with the use of an oxidizing agent. Alternatively, a film which contains oxygen and silicon, such as a silicon oxide film, may be formed on the microcrystalline silicon film 10 by PECVD, for example.

(3) Source/Drain Electrode Formation Step S76:

Referring to FIGS. 15(a) to 15(c), an $n^+$ type silicon film 12 (e.g., 0.05 μm thick) and a source electrode 7 and a drain electrode 8 are formed on the etch stop layer 17 and the oxygen-containing silicon film 11.

The formation of the $n^+$ type silicon film 12 may be performed by PECVD using the same method, and under the same conditions, as those of embodiment 1. The source electrode 7 and the drain electrode 8 may also be formed using the same method, and under the same conditions, as those of embodiment 1. Specifically, a conductive film (0.2 μm thick) for formation of source and drain electrodes is formed by sputtering, and a resist pattern film 15 is formed on the conductive film. Then, the resist pattern film 15 is used as a mask to photolithographically pattern the above-described conductive film. In this way, the source electrode 7 and the drain electrode 8 are obtained.

(4) Source/Drain Separation Step S77:

Subsequently, part of the $n^+$ type silicon film 12 which is not covered with the resist pattern film 15 is removed by etching, whereby contact layers 6a, 6b are obtained. The etching of the $n^+$ type silicon film 12 is performed by, for example, dry etching with the use of a chlorine ($Cl_2$) gas.

Then, the resist pattern film 15 is removed using a peeling solution which contains an organic alkali. Note that, in the shown example, the microcrystalline silicon film 10 and the oxygen-containing silicon film 11 are remaining in a final form of the semiconductor device and constitute the microcrystalline silicon layer 4 and the oxygen-containing silicon layer 5, respectively. In this way, the semiconductor device 104 as shown in FIGS. 11(a) to 11(c) is obtained.

In the above-described series of processes, there is a probability that a side wall 19 (FIG. 11(c)), which is formed by respective ends of the microcrystalline silicon layer 4 and the etch stop layer 17 of the semiconductor device 104, will be exposed to the atmospheric air, or the like, and as a result, an oxidized layer may be formed over the side wall 19. However, the degree of the oxidation is not so large that it would not deteriorate the effects of the invention. The semiconductor device of the present embodiment includes a semiconductor device which has such an oxidized layer.

In the above method, the microcrystalline silicon layer 4 is not damaged by etching in the source/drain separation step. Thus, variations in the semiconductor characteristics, such as mobility, threshold, etc., across the substrate plane are unlikely to occur, so that the productivity can be improved.

Figure 16:
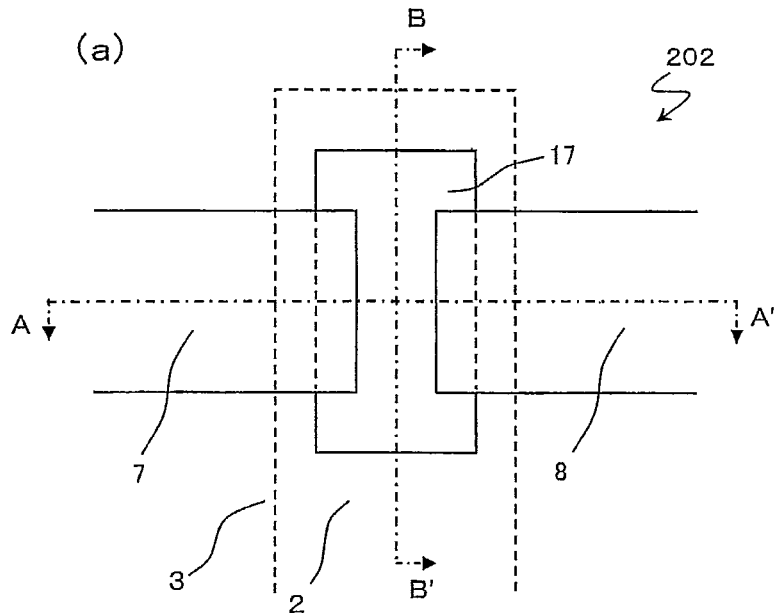
FIG. 16 (a) to (c) are diagrams schematically showing a semiconductor device of a reference example. (a) is a plan view. (b) and (c) are cross-sectional views respectively taken along line A-A' and line B-B' of (a).
Figure 16:
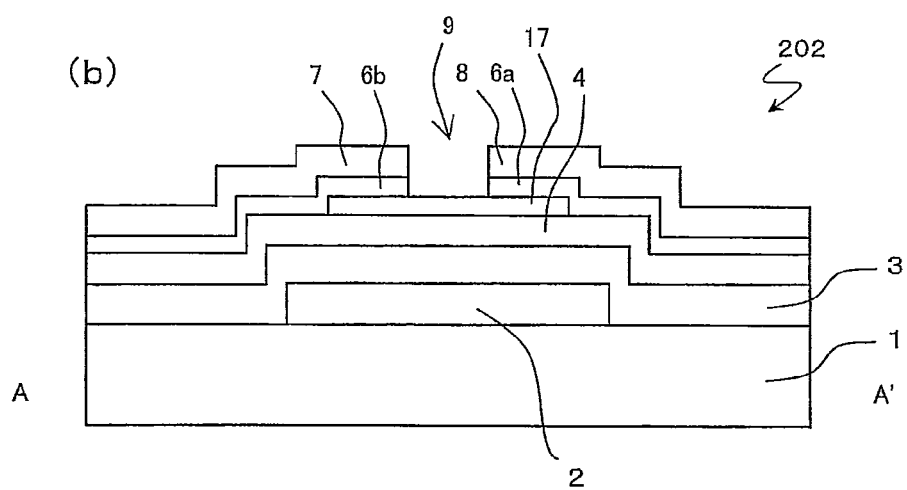
Figure 16:
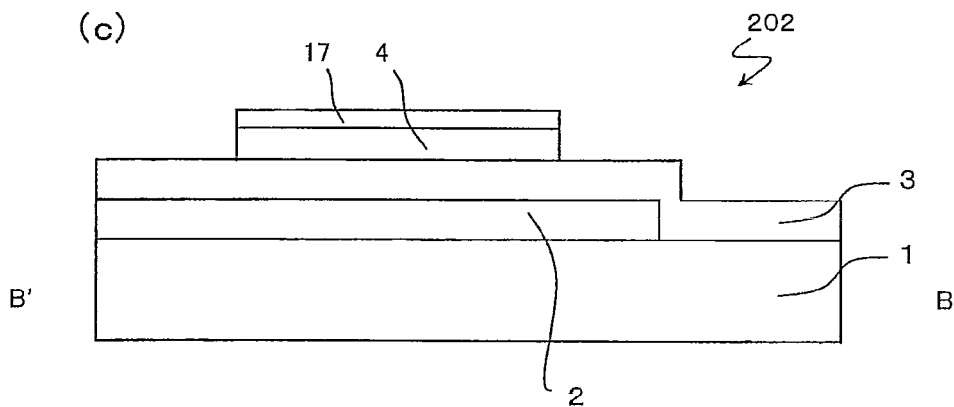

Now, as a reference example, a structure of a semiconductor device is shown in FIG. 16, which is an inverted staggered etch stopper type device having a bottom gate structure and which does not include an oxygen-containing silicon layer. FIG. 16(a) is a plan view of the reference example semiconductor device. FIG. 16(b) is a cross-sectional view taken along line A-A' of FIG. 16(a). FIG. 16(c) is a cross-sectional view taken along line B-B' of FIG. 16(a). For the sake of simplicity, components which are the same as those of the semiconductor device 104 shown in FIGS. 11(a) to 11(c) are indicated by the same reference numerals. In the reference example semiconductor device 202, the microcrystalline silicon layer 4 is used as an active layer so that a high ON current is achieved. However, the OFF current also becomes high at the same time. As such, the ON/OFF ratio cannot be improved. In comparison, the semiconductor device 104 of the present embodiment has the oxygen-containing silicon layer 5 in the midst of the current route between the source and the drain and has an excellent OFF characteristic. Thus, the ON/OFF ratio can be improved as compared with the conventional semiconductor device 202 shown in FIG. 16.

Embodiment 5

Hereinafter, embodiment 5 of the semiconductor device of the present invention is described with reference to the drawings. The semiconductor device of the present embodiment is an inverted staggered etch stopper type TFT which has a bottom gate structure as in embodiment 4.

Figure 17:
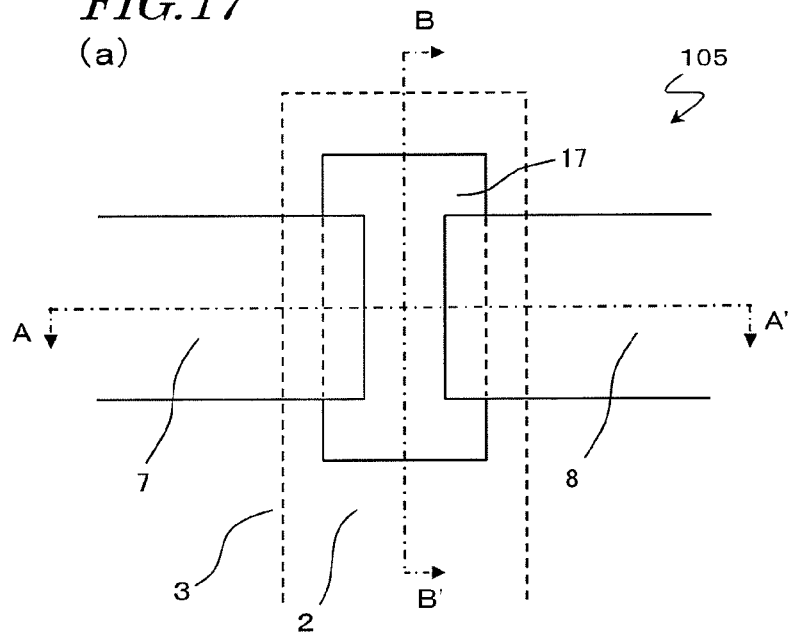
FIG. 17 (a) to (c) are diagrams schematically showing a semiconductor device of embodiment 5 of the present invention. (a) is a plan view. (b) and (c) are cross-sectional views respectively taken along line A-A' and line B-B' of (a).
Figure 17:
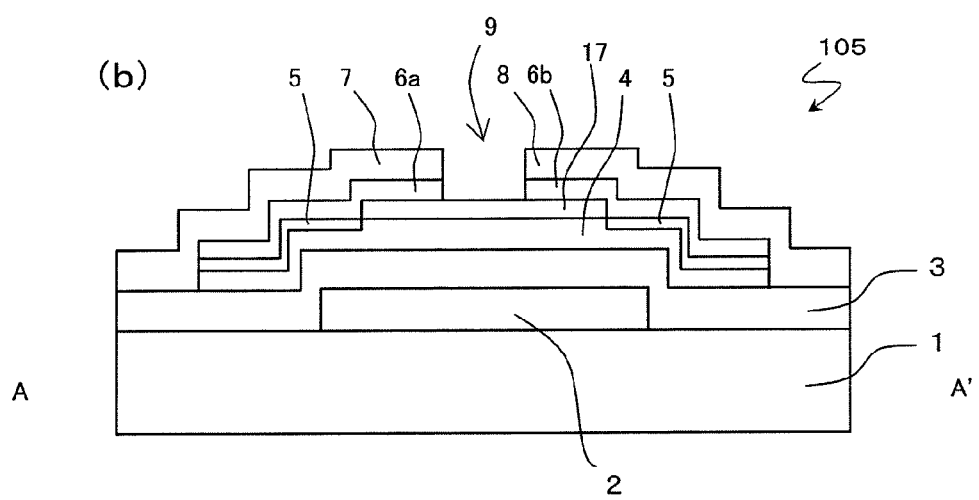
Figure 17:
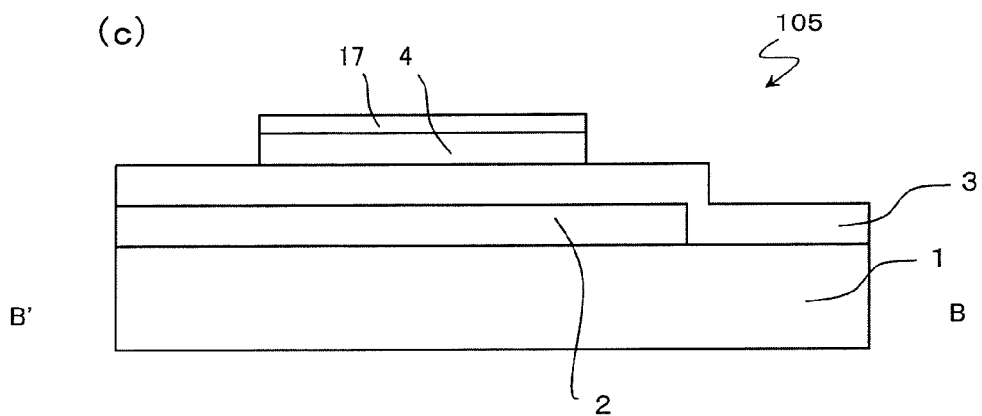

FIG. 17 is a diagram schematically showing the structure of a semiconductor device of the present embodiment. FIG. 17(a) is a plan view of the semiconductor device. FIG. 17(b) is a cross-sectional view taken along line A-A' of FIG. 17(a). FIG. 17(c) is a cross-sectional view taken along line B-B' of FIG. 17(a). For the sake of simplicity, components which are the same as those of the semiconductor device 104 of embodiment 4 are indicated by the same reference numerals, and the descriptions thereof are herein omitted.

The semiconductor device 105 is different from the semiconductor device 104 of embodiment 4 in that the perimeter of the microcrystalline silicon layer 4 is aligned with the ends of the contact layers 6a, 6b and the oxygen-containing silicon layer 5 along the layer stacking direction, and these layers are covered with the source electrode 7 and the drain electrode 8.

The semiconductor device 105 of the present embodiment may be fabricated as described below.

First, a gate electrode, a gate insulating layer, a microcrystalline silicon film, an oxygen-containing silicon film, and an etch stop layer are formed by the same method as that of embodiment 4 previously described with reference to FIG. 13 and FIG. 14. Thereafter, an n+ type silicon film is formed so as to cover the substrate surface.

Then, the microcrystalline silicon film, the oxygen-containing silicon film, and the n+ type silicon film are patterned by the same method as that of embodiment 1 previously described with reference to FIG. 5. From the resultant films, a microcrystalline silicon layer, an oxygen-containing silicon layer, and an n+ type silicon processed film are respectively obtained. Subsequently, a source electrode and a drain electrode are formed by the same method as that of embodiment 1 previously described with reference to FIG. 6.

Thereafter, part of the n+ type silicon processed film which is not covered with any of the source electrode and the drain electrode is removed through the same process as that adopted in the source/drain separation step of embodiment 4, whereby a contact layer is obtained. In the etching step, the microcrystalline silicon layer is prevented from being damaged by overetching because the etch stop layer is provided on the microcrystalline silicon layer.

Therefore, in the present embodiment, the ON/OFF ratio of the semiconductor device can be improved while variation in the semiconductor characteristics across the substrate plane is prevented.

Embodiment 6

Hereinafter, embodiment 6 of the semiconductor device of the present invention is described with reference to the drawings. The semiconductor device of the present embodiment has a top gate structure whereas each of embodiments 1 to 5 previously described is a semiconductor device which has a bottom gate structure.

Figure 18:
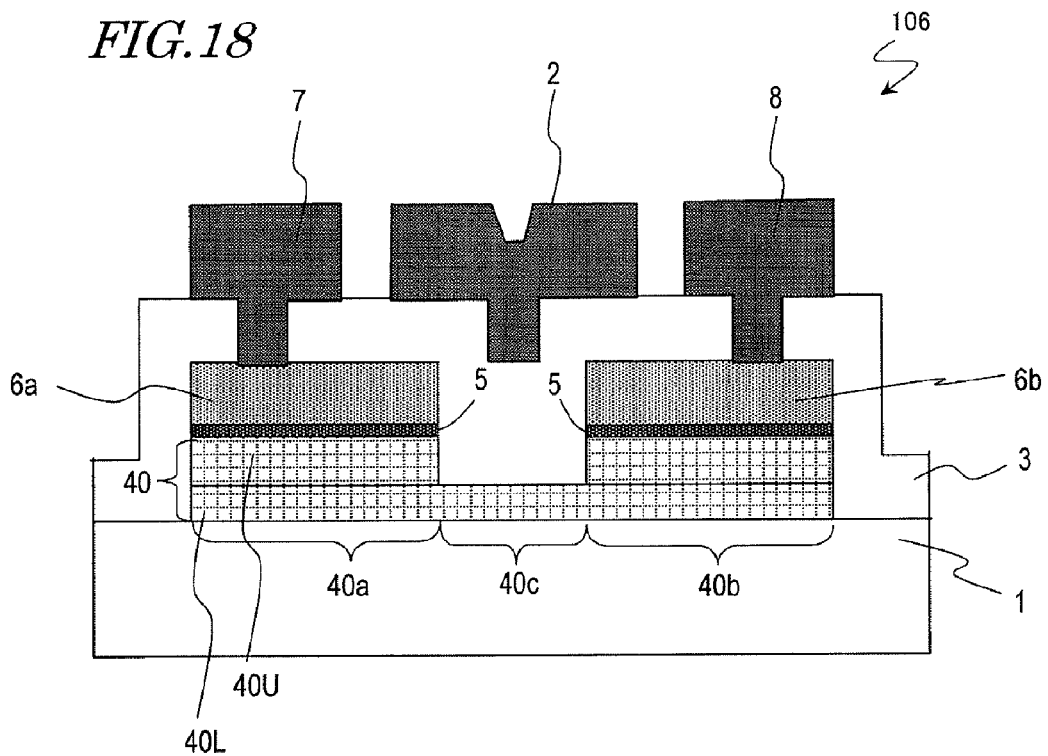
FIG. 18 A cross-sectional view schematically showing a semiconductor device of embodiment 6 of the present invention.

FIG. 18 is a schematic cross-sectional view of an example of the semiconductor device of the present embodiment. For the sake of simplicity, components which are the same as those of the semiconductor device 101 are indicated by the same reference numerals.

The semiconductor device 106 includes a substrate 1, a silicon layer 40 provided on the substrate 1, contact layers 6a, 6b provided on the silicon layer 40, source electrode 7 and drain electrode 8 which are electrically coupled to the silicon layer 40 via the contact layers 6a, 6b, and a gate electrode 2. The silicon layer 40 has a channel region 40c and first and second regions 40a, 40b which are provided on the opposite sides of the channel region 40c. The gate electrode 2 is located over the channel region 40c of the silicon layer 40 such that the gate insulating layer 3 is interposed between the gate electrode 2 and the channel region 40c. Between the first and second regions 40a, 40b of the silicon layer 40 and the contact layers 6a, 6b, the oxygen-containing silicon layers 5 are respectively provided. The fabrication method, thickness, etc., of the oxygen-containing silicon layers 5 are the same as those previously described in embodiments 1 to 5.

In the present embodiment, the silicon layer 40 has a layered structure constituted of a lower layer 40L and an upper layer 40U. In the present embodiment, each of the lower layer 40L and the upper layer 40U is a microcrystalline silicon layer. Note that the lower layer 40L and the upper layer 40U may be any of a polycrystalline silicon layer, a microcrystalline silicon layer, and an amorphous silicon layer. Preferably, at least one of these layers 40L, 40U is a microcrystalline silicon layer. In this case, the ON/OFF ratio can be improved more effectively. Alternatively, the silicon layer 40 may be formed of a single layer.

In the present embodiment also, as in embodiments 1 to 5 previously described, the oxygen-containing silicon layer 5 provided between the silicon layer 40 and the contact layers 6a, 6b has a higher oxygen concentration than in these layers 40, 6a, 6b, and therefore functions as an electric resistor, so that the OFF current can be reduced.

Embodiment 7

Figure 19:
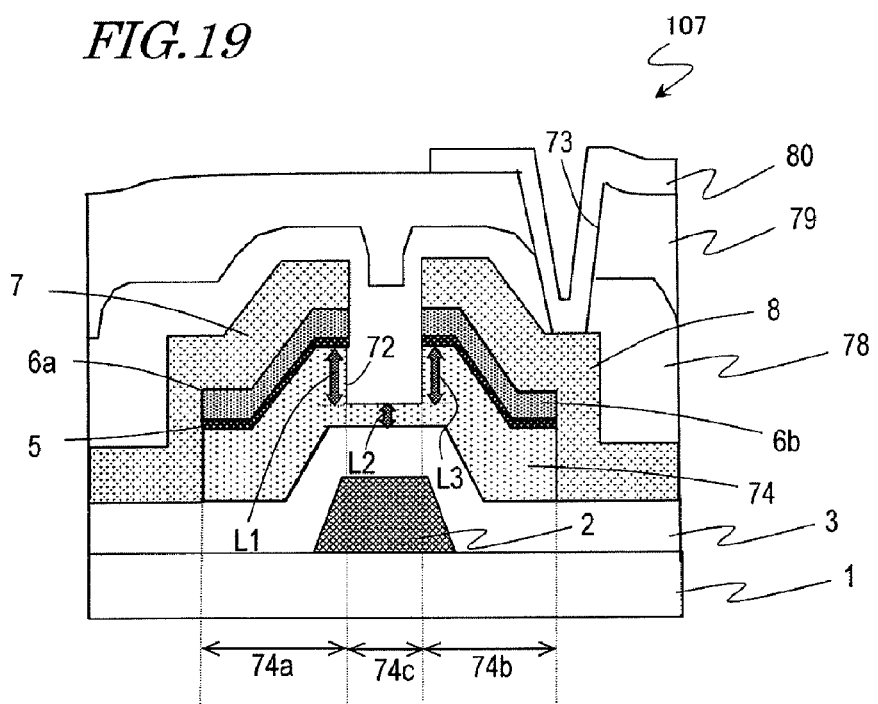
FIG. 19 A cross-sectional view schematically showing a semiconductor device of embodiment 7 of the present invention.

First, the seventh embodiment of the semiconductor device of the present invention is described with reference to the drawings. FIG. 19 is a cross-sectional view of the semiconductor device of the present embodiment. Components which are the same as those of the semiconductor device 101 shown in FIG. 1 are indicated by the same reference numerals, and the descriptions thereof are herein omitted.

The semiconductor device 107 includes a substrate 1, a gate electrode 2 which is provided on the substrate 1, and a gate insulating layer 3 which covers the gate electrode 2. A cross-section of the surface of the gate insulating layer 3 has a protuberance which conforms to the cross-sectional shape of the gate electrode 2. An island-like microcrystalline silicon layer 74 is provided over the gate electrode 2 such that the gate insulating layer 3 is interposed between the microcrystalline silicon layer 74 and the gate electrode 2. An oxygen-containing silicon layer 5 is provided on the microcrystalline silicon layer 74. A contact layer (source region) 6a is provided over a region 74a such that the oxygen-containing silicon layer 5 is interposed between the contact layer 6a and the region 74a. A contact layer (drain region) 6b is provided over a region 74b such that the oxygen-containing silicon layer 5 is interposed between the contact layer 6b and the region 74b.

Part of the microcrystalline silicon layer 74 extending over the gate electrode 2 is raised to a higher level than the other part. At the center of this raised portion, a recess 72 is provided. Part of the microcrystalline silicon layer 74 extending under the bottom surface of the recess 72 has a smaller thickness than the other part. This part is referred to as a region 74c. Parts of the microcrystalline silicon layer 74 on the opposite sides of the region 74c are respectively referred to as the region 74a and the region 74b. With the recess 72 formed therein, the upper surface of the region 74c is closer to the substrate than the upper surfaces of the region 74a and the region 74b at their ends adjacent to the region 74c are.

The contact layer 6a and the contact layer 6b are composed of amorphous silicon or microcrystalline silicon and contain an n-type impurity, e.g., phosphorus or the like.

On the contact layer 6a and the contact layer 6b, a source electrode 7 and a drain electrode 8 are respectively provided. The source electrode 7 and the drain electrode 8 and the inside of the recess 72 are covered with a passivation film 78 which is, for example, a silicon nitride film. The passivation film 78 is covered with a planarizing film 79 which is a transparent resin film. On the passivation film 78, a transparent electrode 80 is provided which is composed of, for example, ITO (Indium-tin-oxide). The transparent electrode 80 is electrically coupled to the drain electrode 8 via a contact hole 73 that is formed in the planarizing film 79 and the passivation film 78. The transparent electrode 80 functions as, for example, a pixel electrode in an active matrix substrate.

When a voltage higher than the threshold is applied to the gate electrode 2, a current flows from the contact layer 6a to the contact layer 6b via the microcrystalline silicon layer 74. In this situation, the current comes out of the contact layer 6a and flows through the region 74a to reach the region 74c, and then passes through the region 74c and the region 74b to reach the contact layer 6b. Parts of the region 74a and the region 74b which are at the side surfaces of the recess 72 are referred to as "offset portions". The channel length is the sum of the vertical lengths of the offset portions, L1 and L3, and the horizontal length of the region 74c.

In the present embodiment, the upper surface of the region 74c is closer to the substrate than the upper surfaces of the region 74a and the region 74b at their ends adjacent to the region 74c are. The distances between the upper surfaces of the region 74a and the region 74b at the ends and the upper surface of the region 74c along the thickness direction of the active layer (the length of the offset portion) are each independently not less than one time and not more than seven times the thickness of the region 74c.

In the present embodiment, the oxygen-containing silicon layer 5 is provided between the microcrystalline silicon layer 74 and the contact layers 6a, 6b. Therefore, the OFF current can be reduced.

In the semiconductor device 107, the channel length can be longer than that of the conventional device by the increments in the lengths of the offset portions on the opposite sides of the region 74c. Because of this arrangement, the OFF current can be further reduced as compared with a device which does not include an offset portion. Thus, the OFF current can be reduced more effectively while the high ON current (high mobility), which is an advantage of the microcrystalline silicon TFT, is secured. Therefore, a higher ON/OFF ratio can be realized.

The semiconductor device 107 can be manufactured using the same method as that adopted to the semiconductor device 101 which has been previously described with reference to FIG. 2 to FIG. 6.

In the present embodiment, in the step of patterning the $n^+$ silicon film to form the contact layers 6a, 6b (source/drain separation step), the etching is allowed to advance even after part of the $n^+$ silicon film exposed via the resist pattern film is completely removed, whereby part of the microcrystalline silicon film is also removed. The etching is stopped when the thickness of the part of the microcrystalline silicon film which is subject to the etching becomes a predetermined thickness in a range of not less than $1/8$ and not more than $1/2$ of the thickness of the microcrystalline silicon film. As a result, the microcrystalline silicon layer 74 shown in FIG. 19 is formed from the microcrystalline silicon film. Here, the thickness of the microcrystalline silicon film is not less than 90 nm and not more than 200 nm (e.g., 130 nm). The thickness of the region 74c of the microcrystalline silicon layer 74 is not less than 20 nm and not more than 60 nm (e.g., 40 nm). The thickness of the regions 74a, 74b is not less than 70 nm and not more than 140 nm (e.g., 90 nm).

After the source/drain separation step, a passivation film 78, a planarizing film 79, and a transparent electrode 80 are formed using a known method. In this way, the semiconductor device 107 is obtained.

Now, the structure of an active matrix type liquid crystal display device which includes any of the above-described semiconductor devices of embodiments 1 to 7 is described with an example of a transmission type liquid crystal display device.

Figure 20:
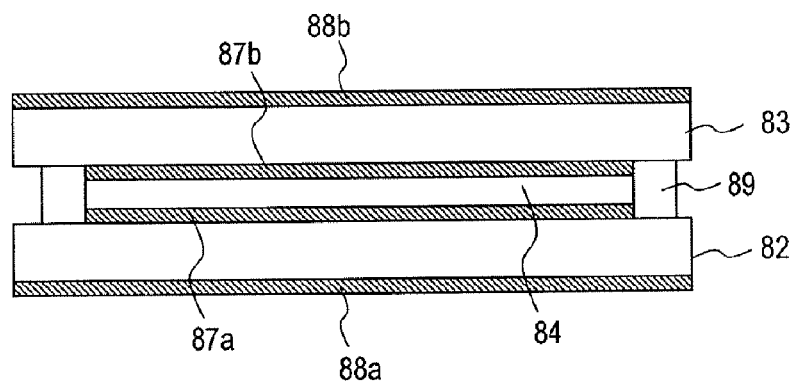
FIG. 20 (a) is a cross-sectional view schematically showing a liquid crystal display device which includes a semiconductor device of the present invention. (b) is a top view schematically showing an active matrix substrate of the liquid crystal display device of (a).
Figure 20:
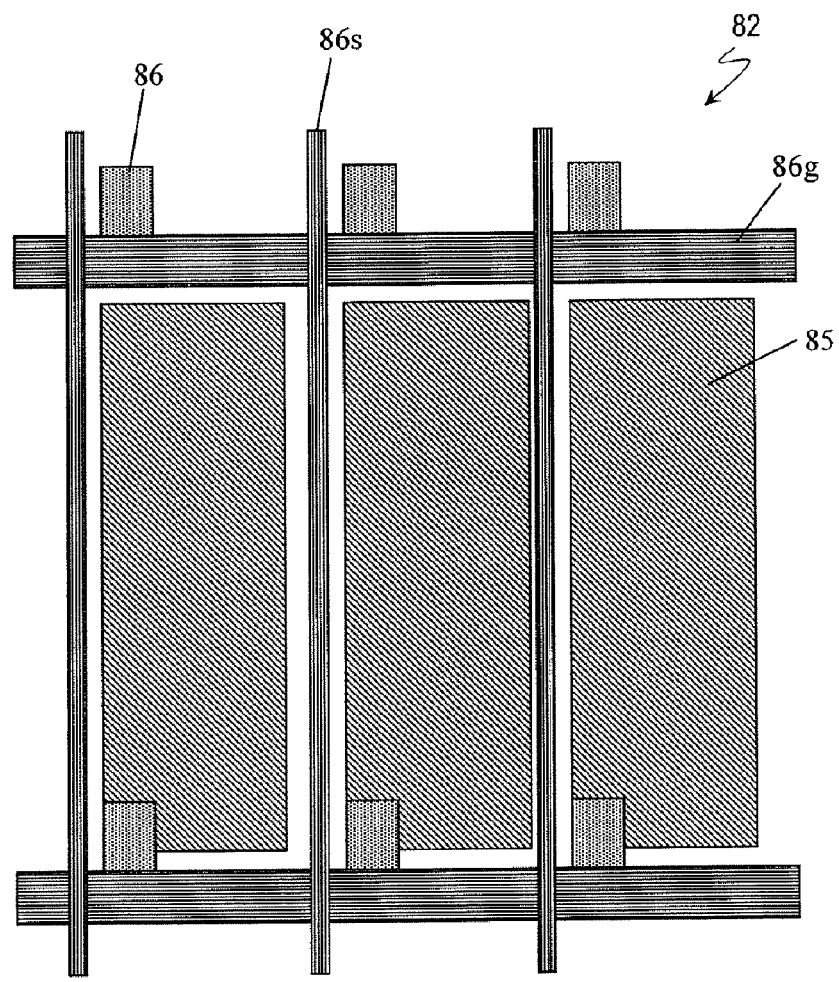

FIG. 20(a) is a cross-sectional view schematically showing the liquid crystal display device. FIG. 20(b) is a top view schematically showing an active matrix substrate of the liquid crystal display device of FIG. 20(a).

As shown in FIG. 20(a), the liquid crystal display device includes an active matrix substrate 82, a counter substrate 83 which is provided so as to oppose the active matrix substrate 82, and a liquid crystal layer 84 provided between these substrates 82, 83. The liquid crystal layer 84 is sealed by a sealant 89 provided between the active matrix substrate 82 and the counter substrate 83. Although not shown, a surface of the counter substrate 83 on the liquid crystal layer side is provided with a color filter and a counter electrode.

Surfaces of the active matrix substrate 82 and the counter substrate 83 on the liquid crystal layer side are respectively provided with alignment films 87a, 87b. The rear side of the active matrix substrate 82 and the viewer side of the counter substrate 83 are respectively provided with polarizers 88a, 88b.

As shown in FIG. 20(b), the active matrix substrate includes a plurality of pixel electrodes 85 which are mutually separated and each of which defines a pixel that is a unit of image display, thin film transistors 86 which are provided to corresponding pixels and which function as switching elements, source wires 86s which are coupled to the pixel electrodes 85 via the thin film transistors 86, and gate wires 86g for selectively driving the thin film transistors 86. The pixel electrodes 85 are formed using a light-transmitting, electrically-conductive material, e.g., ITO (Indium Tin Oxide), or a light-reflecting, electrically-conductive material, e.g., aluminum, silver alloy, or the like. As the thin film transistors 86, the semiconductor devices of the present invention, for example, the above-described semiconductor devices 101 to 107, are used.

Although not shown, the active matrix substrate 82 may include a driver circuit for driving and controlling the respective thin film transistors 86. In this case, as a thin film transistor used in the driver circuit, any of the semiconductor devices 101 to 107 of embodiments 1 to 7 may be used.

INDUSTRIAL APPLICABILITY

A semiconductor device of the present invention is applicable to a wide variety of devices which has thin film transistors, including circuit substrates, such as active matrix substrates and the like, display devices, such as liquid crystal display devices, organic electroluminescence (EL) display devices, inorganic electroluminescence display devices, and the like, imaging devices, such as flat panel type X-ray image sensor devices and the like, and electronic devices, such as image entry devices, fingerprint readers, and the like. In particular, it is advantageously applied to, for example, liquid crystal display devices with high display quality, such as double-speed driving display devices, liquid crystal display devices with low power consumption, and liquid crystal display devices of larger sizes.

The invention claimed is:
1. A semiconductor device, comprising:
a substrate;
an active layer provided on the substrate, the active layer including a channel region and first and second regions that are respectively located on opposite sides of the channel region;
a first contact layer and a second contact layer which are respectively in contact with the first region and the second region of the active layer;
a first electrode electrically coupled to the first region via the first contact layer;
a second electrode electrically coupled to the second region via the second contact layer; and
a gate electrode which is provided such that a gate insulating layer is interposed between the gate electrode and the active layer, the gate electrode being configured to control a conductivity of the channel region, wherein the active layer is constituted of a microcrystalline silicon film which contains a crystal grain and an amorphous phase, the semiconductor device further comprises an oxygen-containing silicon layer between the active layer and the first and second contact layers, and the oxygen-containing silicon layer contains oxygen at a concentration higher than the active layer and the first and second contact layers, and wherein the oxygen-containing silicon layer contains the oxygen at a concentration higher than $1\times10^{20}$ atomns/cm$^3$.

2. The semiconductor device of claim 1, wherein a volume fraction of the amorphous phase in the microcrystalline silicon film is not less than 5% and not more than 95%.

3. The semiconductor device of claim 1, wherein the oxygen-containing silicon layer is a surface oxide film of the active layer.

4. The semiconductor device of claim 1, wherein the gate electrode is provided between the active layer and the substrate.

5. The semiconductor device of claim 1, wherein the semiconductor device has a channel protection type structure.

6. An active matrix substrate, comprising:
the semiconductor device as set forth in claim 1.

7. A display device, comprising:
the semiconductor device as set forth in claim 1.

* * * * *